United States Patent
Yang et al.

(10) Patent No.: US 8,316,206 B2
(45) Date of Patent: Nov. 20, 2012

(54) PILOT PLACEMENT FOR NON-VOLATILE MEMORY

(75) Inventors: Xueshi Yang, Sunnyvale, CA (US); Zining Wu, Los Altos, CA (US); Pantas Sutardja, Los Gatos, CA (US)

(73) Assignee: Marvell World Trade Ltd., St. Michael (BB)

( * ) Notice: Subject to any disclaimer, the term of this patent is extended or adjusted under 35 U.S.C. 154(b) by 707 days.

(21) Appl. No.: 12/029,134

(22) Filed: Feb. 11, 2008

(65) Prior Publication Data

US 2008/0195822 A1   Aug. 14, 2008

Related U.S. Application Data

(60) Provisional application No. 60/889,441, filed on Feb. 12, 2007.

(51) Int. Cl.
*G06F 12/00* (2006.01)
(52) U.S. Cl. ............... 711/202; 711/103; 711/E12.103; 365/185.09
(58) Field of Classification Search ............... None
See application file for complete search history.

(56) References Cited

U.S. PATENT DOCUMENTS

| | | | |
|---|---|---|---|
| 6,279,133 B1 | 8/2001 | Vafai et al. | |
| 6,501,812 B1 | 12/2002 | Yada | |
| 2003/0156454 A1 | 8/2003 | Wei et al. | |
| 2007/0067704 A1 | 3/2007 | Altintas et al. | |
| 2007/0124647 A1* | 5/2007 | Chen et al. | 714/763 |
| 2007/0143561 A1* | 6/2007 | Gorobets | 711/170 |
| 2007/0143567 A1* | 6/2007 | Gorobets | 711/202 |
| 2007/0171730 A1 | 7/2007 | Ramamoorthy et al. | |
| 2007/0300130 A1* | 12/2007 | Gorobets | 714/766 |
| 2008/0062761 A1* | 3/2008 | Tu et al. | 365/185.09 |

FOREIGN PATENT DOCUMENTS

| | | | |
|---|---|---|---|
| GB | 2 418 820 A | | 4/2006 |
| WO | WO2007/132453 A | | 11/2007 |

OTHER PUBLICATIONS

The International Search Report and The Written Opinion of The International Searching Authority, or The Declaration mailed Mar. 3, 2009 for International Application No. PCT/US2008/074414 filed Aug. 27, 2008; 13 pages.
Office Action dated Apr. 22, 2011 issued in corresponding Chinese Patent Application No. 200880004767.4, 12 pages.

* cited by examiner

*Primary Examiner* — Charles Rones
*Assistant Examiner* — Arvind Talukdar

(57) ABSTRACT

A memory control module includes a format module that communicates with a memory array that includes B memory blocks each including P physical pages and Q logical pages. The format module selects X predetermined locations to write pilot data and read-back pilot signals in each of the B memory blocks. B, P, Q and X are integers greater than or equal to 1. The memory control module also includes a signal processing module that compares the written pilot data to the read-back pilot signals and that determines variations between the written pilot data and the read-back pilot signals based on the comparison.

43 Claims, 19 Drawing Sheets

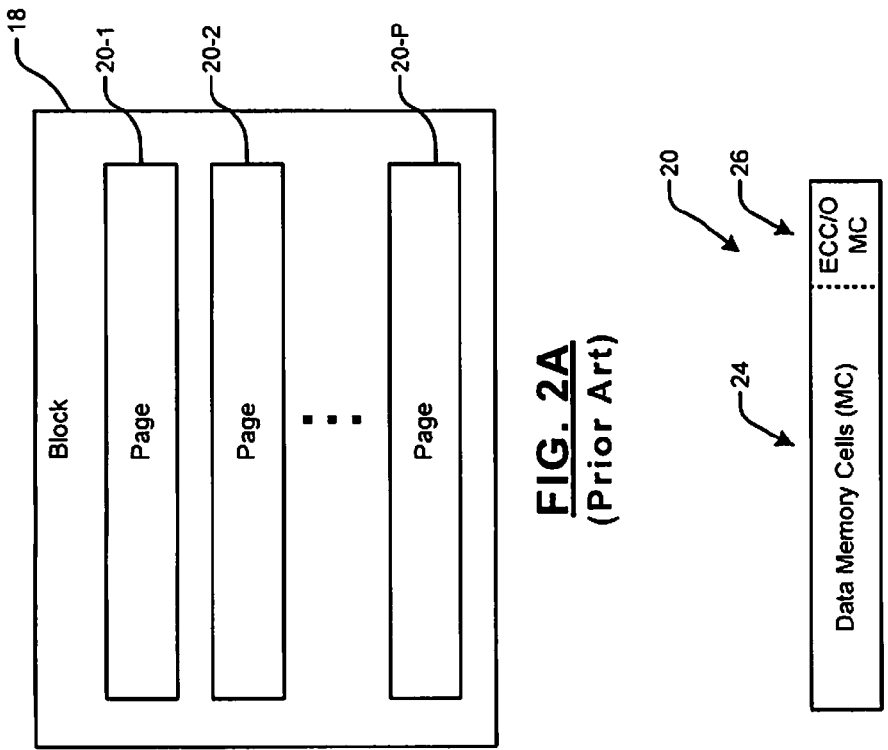
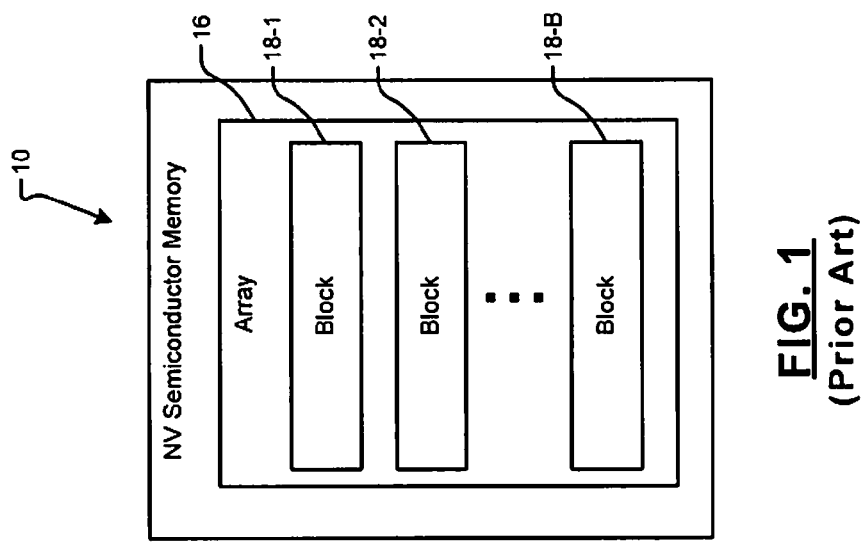

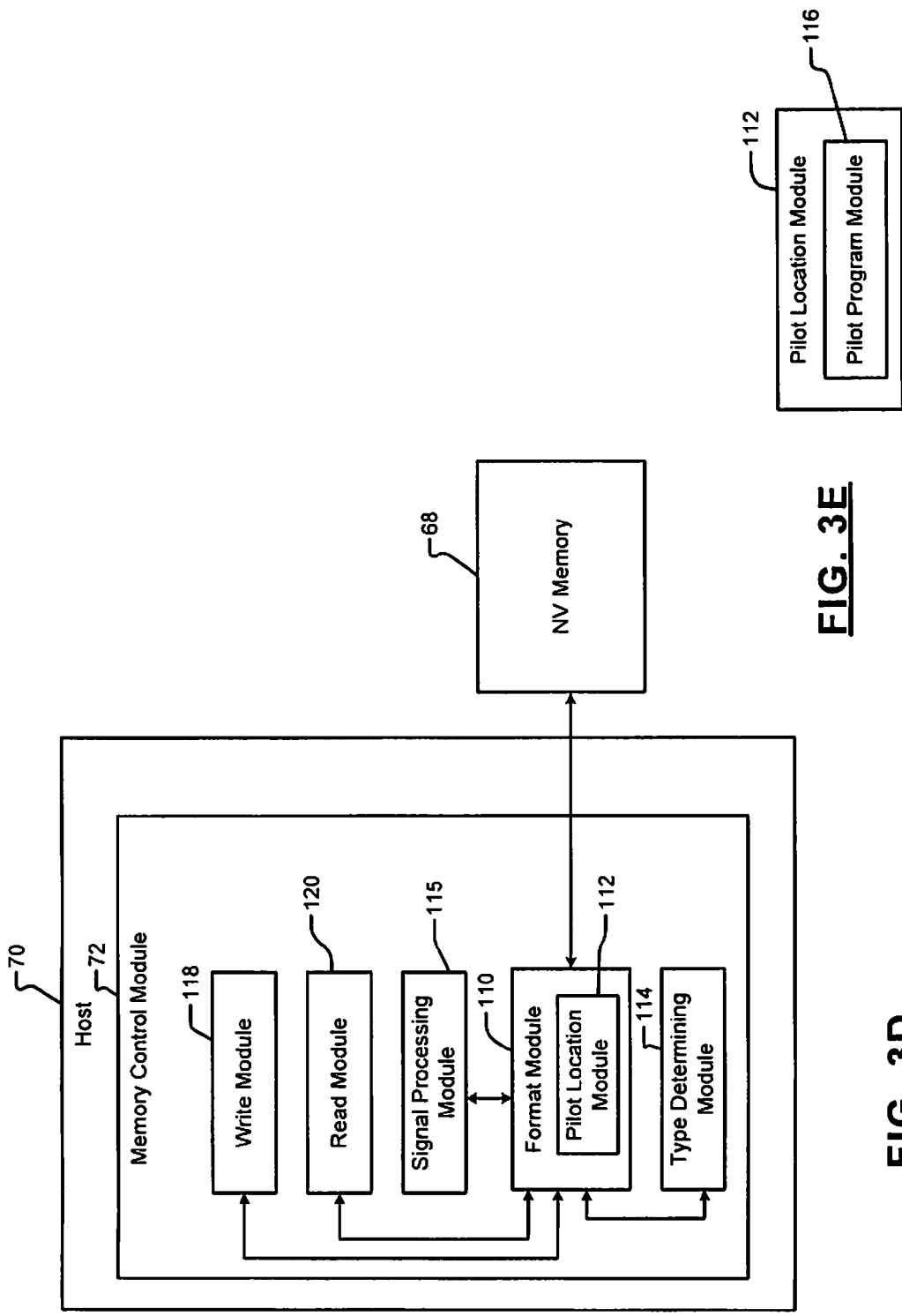

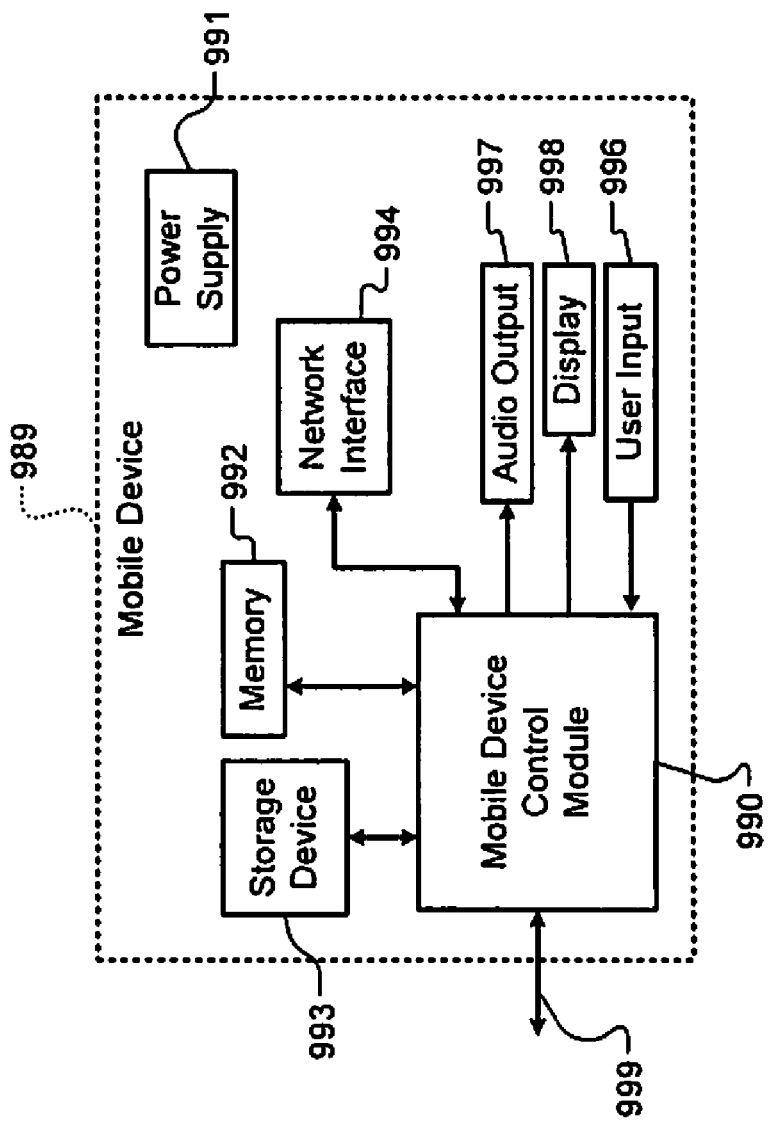

PILOT PLACEMENT FOR NON-VOLATILE MEMORY

CROSS-REFERENCE TO RELATED APPLICATIONS

This application claims the benefit of U.S. Provisional Application No. 60/889,441, filed on Feb. 12, 2007. The disclosure of the above application is incorporated herein by reference in its entirety.

FIELD

The present disclosure relates to memory and, more particularly, to non-volatile memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIGS. 1, 2A and 2B, non-volatile semiconductor memory 10 may include flash memory, static random access memory (SRAM), nitride read only memory (NROM), phase change memory, magnetic RAM, multi-state memory, etc. The non-volatile semiconductor memory 10 may include one or more arrays 16. The array 16 may be arranged as B memory blocks 18-1, 18-2, . . . , and 18-B (collectively referred to as blocks 18).

In FIG. 2A, each block 18 includes P pages 20-1, 20-2, . . . , and 20-P (collectively referred to as pages 20). In FIG. 2B, each page 20 may include a plurality of memory cells that are associated with a data portion 24 and may include other memory cells that are associated with an overhead data portion 26 such as error checking and correcting (ECC) data or other (O) overhead data.

The non-volatile semiconductor memory 10 typically communicates with a memory control module of a host device. Usually, the control module addresses the memory using a hardwired block size. Pages in the block may also have a hardwired physical page size and may therefore be referred to as physical pages. The number of memory cells in the data and overhead portions 24 and 26, respectively, may also be hardwired.

For example only, a NAND flash array may include 16384 blocks for a total of 2 Gigabytes (GB) of memory. Each block may include 128 kilobytes (kB) in 64 pages. Each page may include 2112 bytes. Of the 2112 bytes, 2048 bytes may be associated with the data portion and 64 bytes may be associated with the overhead portion. Each memory cell may store a bit. To erase data stored in the array, the memory control module typically requires either an entire block and/or an entire page to be erased.

In FIG. 2C, the memory block 18 includes physical pages 50-1, 50-2, . . . , and 50-P (collectively referred to as pages 50). Each page 50 includes Y memory cells (memory cells 46-1, 46-2, . . . , and 46-Y) for the data portion and Z memory cells (memory cells 46-(Y+1), 46(Y+2), . . . , and 46(Y+Z)) for the overhead portion, where Y and Z are fixed values for a particular memory control module. During a first write operation for a first write data block, the memory control module writes data to pages 50-1 and 50-2 and part of page 50-3. During a second write operation for a second write data block, data is written to pages 50-4 and 50-5 and part of page 50-6. The remaining memory cells in pages 50-3 and 50-6 are unused.

Referring now to FIG. 2D, another memory block 80 is illustrated that includes both physical and logical pages. A memory control module (not shown) may format physical pages 50-1 to 50-6 to appear as logical pages 51-1 to 51-3 for read/write operations. In other words, data is written to memory blocks according to the logical pages instead of according to the physical pages.

SUMMARY

A memory control module includes a format module that communicates with a memory array that includes B memory blocks each including P physical pages and Q logical pages. The format module selects X predetermined locations to write pilot data and read-back pilot signals in each of the B memory blocks. B, P, Q and X are integers greater than or equal to 1. The memory control module also includes a signal processing module that compares the written pilot data to the read-back pilot signals and that determines variations between the written pilot data and the read-back pilot signals based on the comparison.

In other features, the pilot data is embedded with user data during read, write and erase operations of the memory array. The format module selectively sets one of a start and an end for each of the Q logical pages. The format module selectively sets one of a start and an end for each of the P physical pages. The memory control module further includes at least one of a write module that selectively writes data that includes the pilot data to the memory array and a read module that selectively reads back the data from the memory array.

In other features, the signal processing module at least one of ignores the variations in subsequent read/write operations and does not write/read from the locations in the memory array where the variations occur in subsequent read/write operations. The variations are caused at least in part from one of physical disturbances to the memory array and defects within the memory array.

In other features, the memory control module includes a pilot location module that sets M of the X predetermined locations. Each of the Q logical pages includes one of a start and an end. The M predetermined locations are the same for each of the Q logical pages relative to the start and end. M is an integer greater than or equal to 1. The pilot location module sets at least one of the M predetermined locations at the start, the end, and a location within each of the Q logical pages. The location includes a middle of each of the Q logical pages. The pilot location module sets the M predetermined locations in a predetermined pattern within each of the Q logical pages. The pilot location module sets the at least one of the M predetermined locations at the start and further sets at least another one of the M predetermined locations next to the end.

In other features, the memory control module includes a pilot location module that sets M of the X predetermined locations. Each of the P physical pages includes one of a start and an end. The M predetermined locations are the same for each of the P physical pages relative to the start and end. M is an integer greater than or equal to 1. The pilot location module sets at least one of the M predetermined locations at the start, the end, and a location within each of the P physical pages. The location includes a middle of each of the P physical pages. The pilot location module sets the M predetermined locations in a predetermined pattern within each of the P physical pages. The pilot location module sets the at least one of the M predetermined locations at the start and further sets at least another one of the M predetermined locations next to the end.

In other features, a memory system includes the memory control module and further includes the memory array. The memory array includes at least one of flash memory, static random access memory (SRAM), nitride read only memory (NROM), phase change memory, magnetic RAM, and multi-state memory. The format module generates a memory map of the memory array. The format module at least one of adjusts the memory map to at least one of indicate portions of the memory array where the variations occur and discontinues use of the portions of the memory array where the variations occur.

In other features, a method for operating a memory control module includes selecting X predetermined locations to write pilot data and read-back pilot signals in each of B memory blocks of a memory array. The B memory blocks each include P physical pages and Q logical pages. B, P, Q and X are integers greater than or equal to 1. The method also includes comparing the written pilot data to the read-back pilot signals. The method also includes determining variations between the written pilot data and the read-back pilot signals based on the comparison.

In other features, the method includes reading, writing and erasing pilot data embedded in user data. The method also includes selectively setting one of a start and an end for each of the Q logical pages. The method also includes selectively setting one of a start and an end for each of the P physical pages. The method also includes at least one of selectively writing data that includes the pilot data to the memory array and selectively reading back the data from the memory array. The signal processing module at least one of ignores the variations in subsequent read/write operations and does not write/read from the locations in the memory array where the variations occur in subsequent read/write operations. The variations are caused at least in part from one of physical disturbances to the memory array and defects within the memory array.

In other features, the method includes setting M of the X predetermined locations. Each of the Q logical pages includes one of a start and an end. The M predetermined locations are the same for each of the Q logical pages relative to the start and end, where M is an integer greater than or equal to 1. The method also includes setting at least one of the M predetermined locations at the start, the end, and a location within each of the Q logical pages. The location includes a middle of each of the Q logical pages.

In other features, the method includes setting the M predetermined locations in a predetermined pattern within each of the Q logical pages. The method also includes setting the at least one of the M predetermined locations at the start and setting at least another one of the M predetermined locations next to the end. The method also includes setting M of the X predetermined locations. Each of the P physical pages includes one of a start and an end. The M predetermined locations are the same for each of the P physical pages relative to the start and end, where M is an integer greater than or equal to 1.

In other features, the method includes setting at least one of the M predetermined locations at the start, the end, and a location within each of the P physical pages. The location includes a middle of each of the P physical pages. The method also includes setting the M predetermined locations in a predetermined pattern within each of the P physical pages. The method also includes setting the at least one of the M predetermined locations at the start and setting at least another one of the M predetermined locations next to the end.

In other features, the memory array includes at least one of flash memory, static random access memory (SRAM), nitride read only memory (NROM), phase change memory, magnetic RAM, and multi-state memory. The method also includes generating a memory map of the memory array. The method also includes at least one of adjusting the memory map to at least one of indicate portions of the memory array where the variations occur and discontinue use of the portions of the memory array where the variations occur.

In other features, control means for controlling memory includes format means for communicating with array means for storing data. The array means includes B memory blocks each including P physical pages and Q logical pages. The format means selects X predetermined locations to write pilot data and read-back pilot signals in each of the B memory blocks. B, P, Q and X are integers greater than or equal to 1. The control means also includes signal processing means for comparing the written pilot data to the read-back pilot signals and for determining variations between the written pilot data and the read-back pilot signals based on the comparison.

In other features, the pilot data is embedded with user data during read, write and erase operations of the array means. The format means selectively sets one of a start and an end for each of the Q logical pages. The format means selectively sets one of a start and an end for each of the P physical pages. The control means further includes at least one of write means for selectively writing data that includes the pilot data to the array means and read means for selectively reading back the data from the array means.

In other features, the signal processing means at least one of ignores the variations in subsequent read/write operations and does not write/read from the locations in the array means where the variations occur in subsequent read/write operations. The variations are caused at least in part from one of physical disturbances to the array means and defects within the array means.

In other features, the control means includes pilot location means for setting M of the X predetermined locations. Each of the Q logical pages includes one of a start and an end. The M predetermined locations are the same for each of the Q logical pages relative to the start and end. M is an integer greater than or equal to 1. The pilot location means sets at least one of the M predetermined locations at the start, the end, and a location within each of the Q logical pages. The location includes a middle of each of the Q logical pages. The pilot location means sets the M predetermined locations in a predetermined pattern within each of the Q logical pages. The pilot location means sets the at least one of the M predetermined locations at the start and further sets at least another one of the M predetermined locations next to the end.

In other features, the control means includes pilot location means for setting M of the X predetermined locations. Each of the P physical pages includes one of a start and an end. The M predetermined locations are the same for each of the P physical pages relative to the start and end. M is an integer greater than or equal to 1. The pilot location means sets at least one of the M predetermined locations at the start, the end, and a location within each of the P physical pages. The location includes a middle of each of the P physical pages. The pilot location means sets the M predetermined locations in a predetermined pattern within each of the P physical pages. The pilot location means sets the at least one of the M predetermined locations at the start and further sets at least another one of the M predetermined locations next to the end.

In other features, a memory system includes the control means and further includes the array means. The array means includes at least one of flash memory, static random access memory (SRAM), nitride read only memory (NROM), phase change memory, magnetic RAM, and multi-state memory. The format means generates a memory map of the array means. The format means at least one of adjusts the memory map to at least one of indicate portions of the array means where the variations occur and discontinues use of the portions of the array means where the variations occur.

In still other features, the systems and methods described above are implemented by a computer program executed by one or more processors. The computer program can reside on a computer readable medium such as but not limited to memory, non-volatile data storage and/or other suitable tangible storage mediums.

The computer program includes selecting X predetermined locations to write pilot data and read-back pilot signals in each of B memory blocks of a memory array. The B memory blocks each include P physical pages and Q logical pages. B, P, Q and X are integers greater than or equal to 1. The computer program also includes comparing the written pilot data to the read-back pilot signals. The computer program also includes determining variations between the written pilot data and the read-back pilot signals based on the comparison.

In other features, the computer program includes reading, writing and erasing pilot data embedded in user data. The computer program also includes selectively setting one of a start and an end for each of the Q logical pages. The computer program also includes selectively setting one of a start and an end for each of the P physical pages. The computer program also includes at least one of selectively writing data that includes the pilot data to the memory array and selectively reading back the data from the memory array. The signal processing module at least one of ignores the variations in subsequent read/write operations and does not write/read from the locations in the memory array where the variations occur in subsequent read/write operations. The variations are caused at least in part from one of physical disturbances to the memory array and defects within the memory array.

In other features, the computer program includes setting M of the X predetermined locations. Each of the Q logical pages includes one of a start and an end. The M predetermined locations are the same for each of the Q logical pages relative to the start and end, where M is an integer greater than or equal to 1. The computer program also includes setting at least one of the M predetermined locations at the start, the end, and a location within each of the Q logical pages. The location includes a middle of each of the Q logical pages.

In other features, the computer program includes setting the M predetermined locations in a predetermined pattern within each of the Q logical pages. The computer program also includes setting the at least one of the M predetermined locations at the start and setting at least another one of the M predetermined locations next to the end. The computer program also includes setting M of the X predetermined locations. Each of the P physical pages includes one of a start and an end. The M predetermined locations are the same for each of the P physical pages relative to the start and end, where M is an integer greater than or equal to 1.

In other features, the computer program includes setting at least one of the M predetermined locations at the start, the end, and a location within each of the P physical pages. The location includes a middle of each of the P physical pages. The computer program also includes setting the M predetermined locations in a predetermined pattern within each of the P physical pages. The computer program also includes setting the at least one of the M predetermined locations at the start and setting at least another one of the M predetermined locations next to the end.

In other features, the memory array includes at least one of flash memory, static random access memory (SRAM), nitride read only memory (NROM), phase change memory, magnetic RAM, and multi-state memory. The computer program also includes generating a memory map of the memory array. The computer program also includes at least one of adjusting the memory map to at least one of indicate portions of the memory array where the variations occur and discontinue use of the portions of the memory array where the variations occur.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a functional block diagram of memory including blocks according to the prior art;

FIG. 2A illustrates pages within the blocks of memory according to the prior art;

FIG. 2B illustrates memory cells within the pages according to the prior art;

FIG. 3D is an exemplary functional block diagram of the memory system of FIG. 3A in further detail;

FIG. 3E illustrates an exemplary pilot location module;

FIG. 11G is a functional block diagram of a mobile device.

DETAILED DESCRIPTION

Figure 2C:
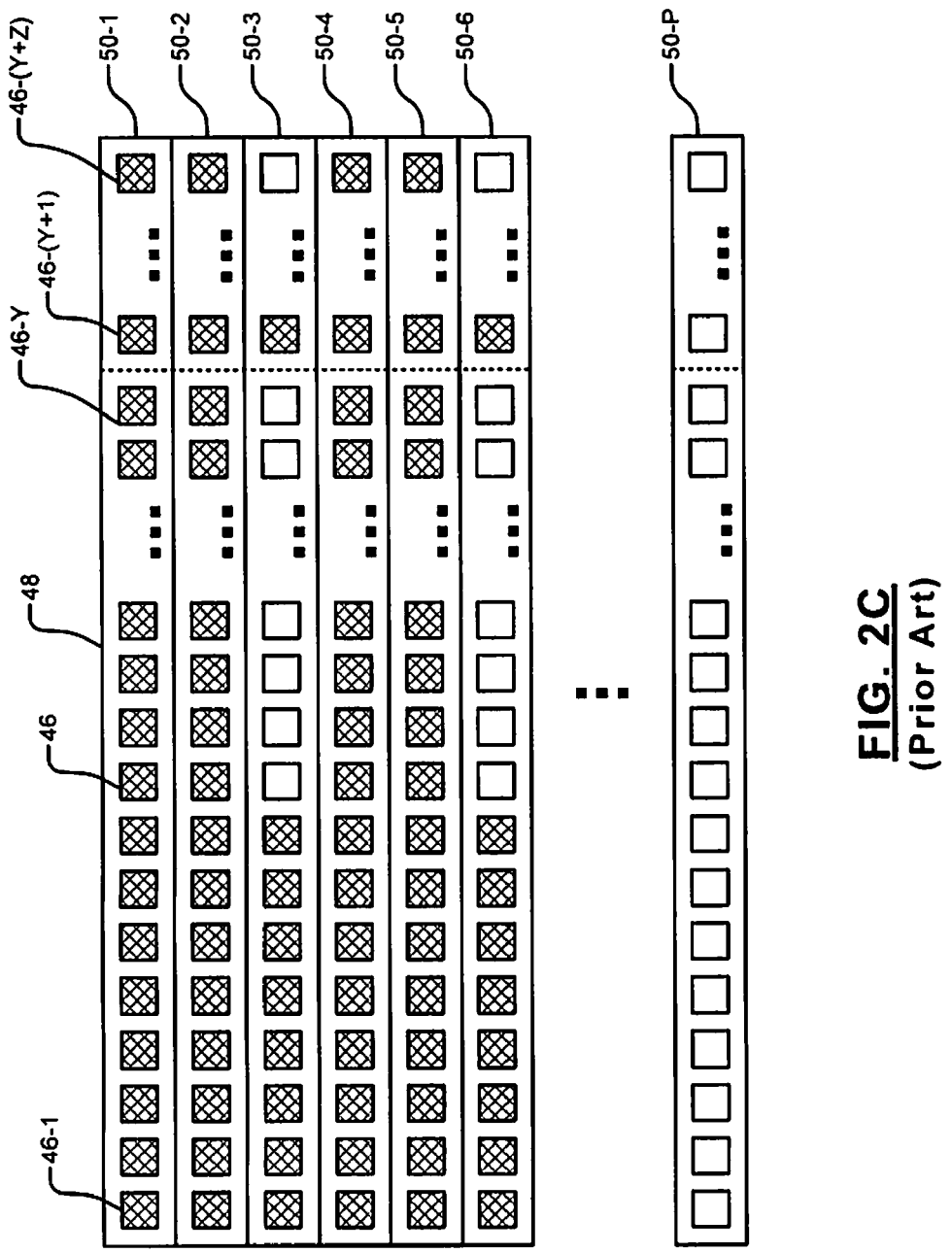
FIG. 2C illustrates memory cells arranged in a memory block according to the prior art.
Figure 2D:
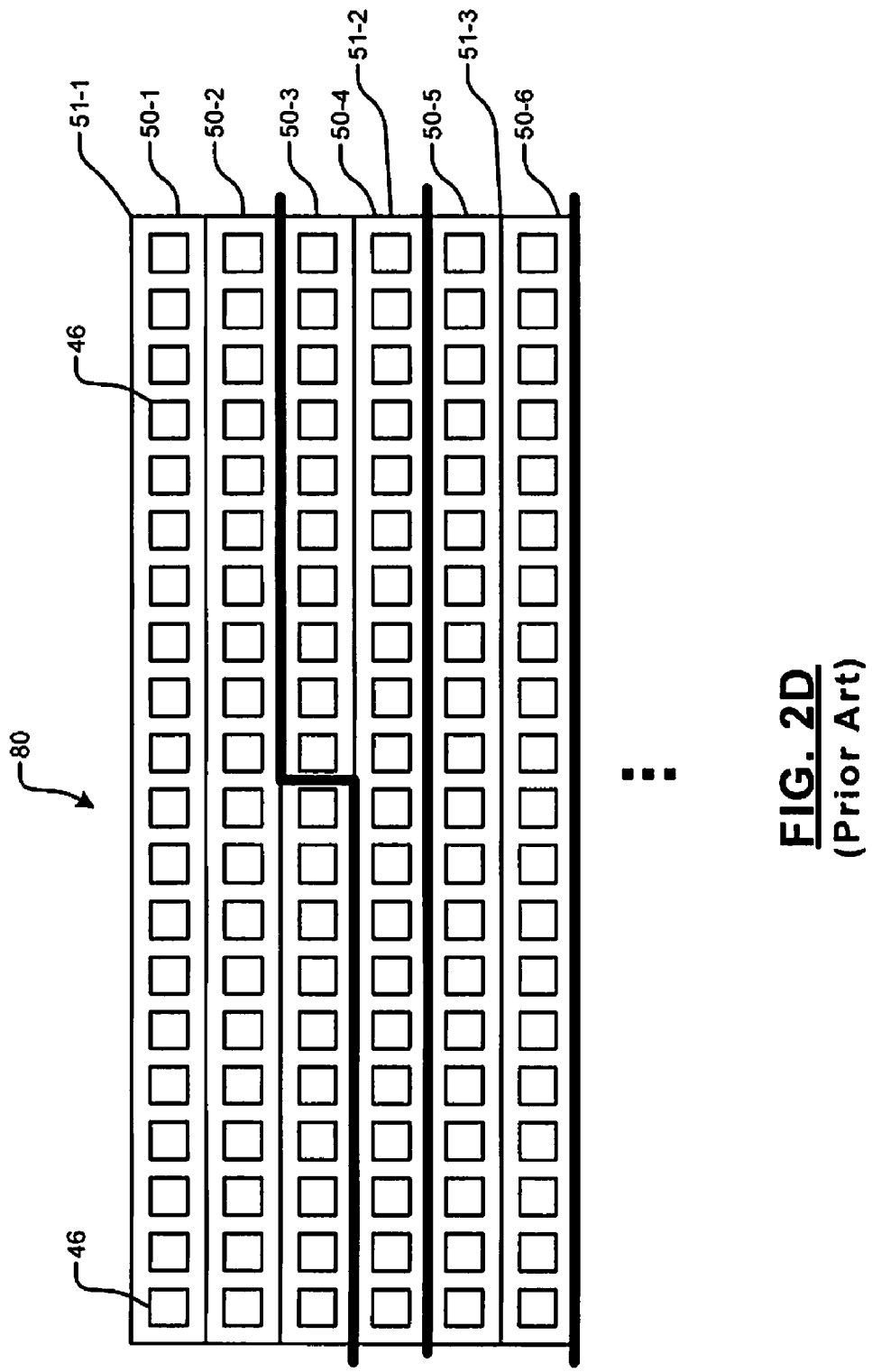
FIG. 2D illustrates memory cells arranged in a memory block according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Pilot data may be stored in locations in memory. The pilot data may include a predetermined data pattern. The data pattern is subject to similar disturbances as other data stored in the memory. Pilot signals may be read from the pilot data. A signal processing module may analyze pilot signals based on the pilot data. The signal processing module may determine statistical parameters for disturbances for a block of memory that includes the pilot data based on the analysis. For example, a disturbance such as noise may have statistical parameters such as the magnitude and length of the noise.

A physical page may be a grouping of memory cells having a hardwired size. A logical page may include formatted start and end-points within one or more physical pages. Logical pages may be used when data to be stored in memory has a length that differs from a length of a physical page. In most cases, the logical page size and physical page size are different. Thus, one logical page may be segmented and saved in different physical pages. A control module may set locations for pilot data in physical and/or logical pages.

Disturbance parameters, such as noise, vary across different logical and physical pages due to read/write cycling, manufacturing variations, and/or operating environment conditions. A signal processing module of the control module may receive a pilot signal, compare the pilot signal to the pilot data and determine disturbance parameters based differences between pilot signal and the pilot data. Increasing the number of locations for pilot data may increase the accuracy of disturbance determinations based on pilot signal processing. Further, all logical pages should include locations for pilot data. Therefore, the present disclosure includes providing predetermined locations for pilot data. All logical and/or all physical pages may include a same number of locations for pilot data. The locations may be the same relative to start and end-points of the pages.

In current flash memories, pilot cells are places in a location that is separate from data storage cells. For example, the pilot cells may be placed in an error correction code (ECC)/ overhead portion; or they may be placed in a system area that is not accessible by users. In the present disclosure, a memory system uses an embedded scheme that places (embeds) pilot cells along with user data. In such scheme, the pilot data and user data undergo the same read/write/erase cycles. Therefore, read-back pilot signals provide an accurate indication of noise and disturbance of the user data.

Figure 3A:
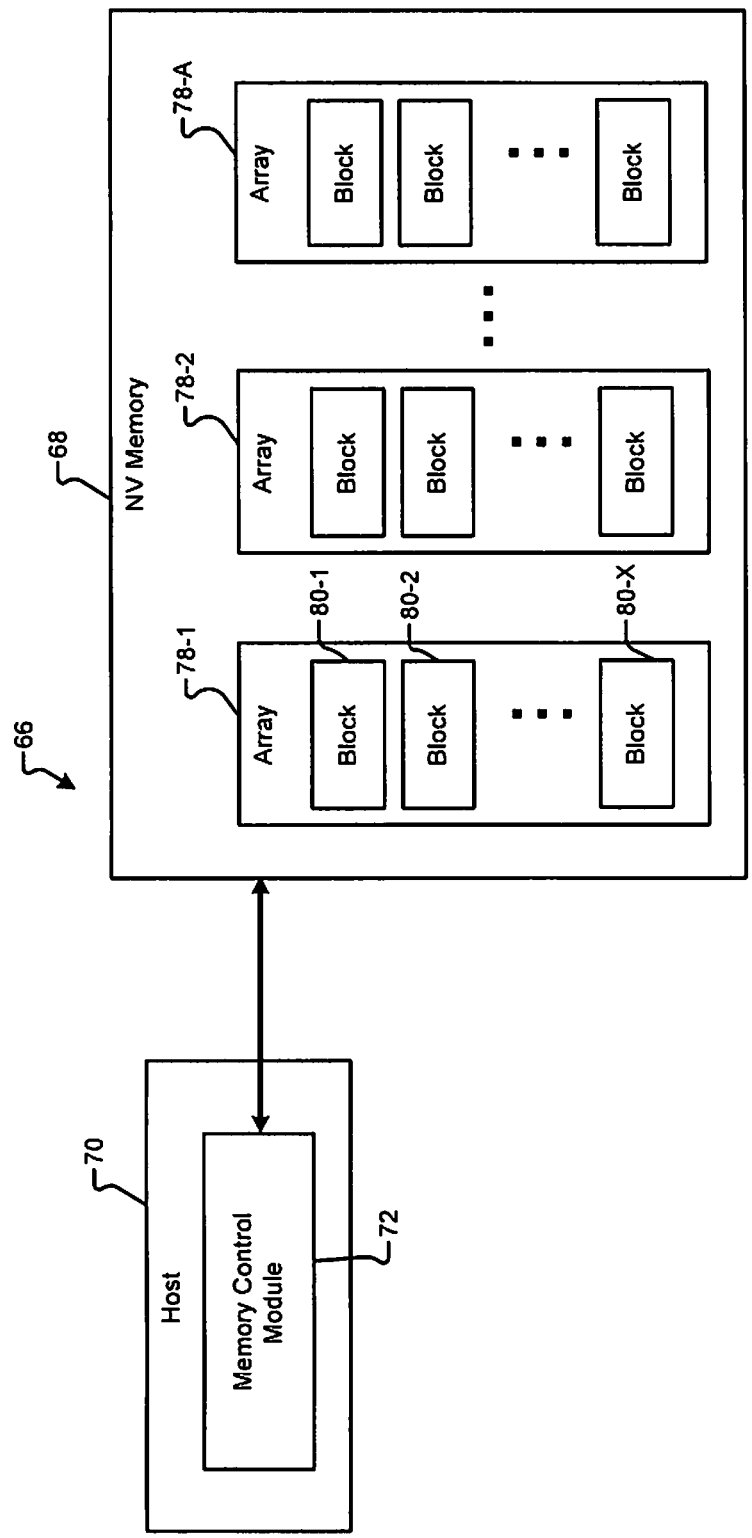
FIG. 3A is a functional block diagram of a memory system according to the present disclosure with an memory control module.

Referring now to FIGS. 3A-3E, a memory system 66 for non-volatile semiconductor memory 68 is illustrated. In FIG. 3A, a host device 70 includes a control module 72. The control module 72 may vary the number of memory cells per page in non-volatile semiconductor memory 68. The control module 72 may vary the number of memory cells allocated for the data portion and for the overhead portion for each page. The control module 72 may also determine locations for pilot data within the non-volatile memory 68.

A format module 110 of the control module 72 may format the memory 68 with locations for pilot data. The format module 110 may include a pilot location module 112 that sets locations for pilot data in the memory 68. A pilot program module 116 programs known patterns into the locations to facilitate fast acquisition of noise and disturbance parameters.

The format module 110 may set locations for pilot data at a start, middle, and/or end of a physical page and/or a logical page. The format module 110 may also distribute locations for pilot data according to a known pattern. Physical pages may be predefined and hardwired into the non-volatile memory 68. Logical pages may be logical constructions within one or more physical pages and might not be hardwired.

Figure 3B:
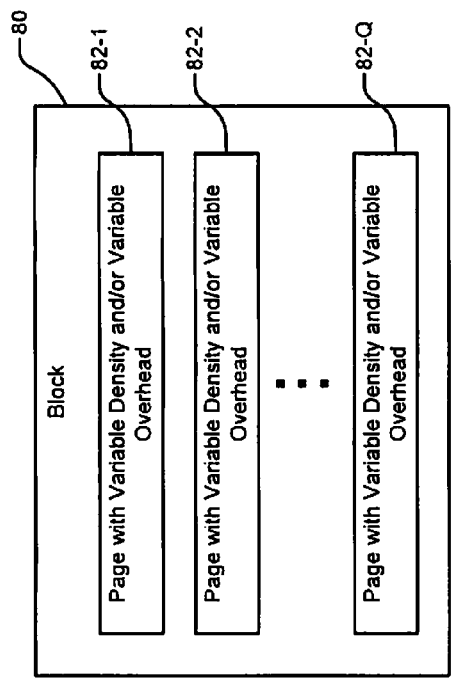
FIG. 3B illustrates a memory block including pages with variable density, page length and/or overhead.

The non-volatile semiconductor memory 68 may include one or more arrays 78-1, 78-2, . . . , and 78-A (collectively array 78) of memory cells. The array 78 may be arranged in memory blocks 80-1, 80-2, . . . , and 80-X (collectively referred to as blocks 80). In FIG. 3B, each block 80 includes physical pages 82-1, 82-2, . . . , and 82-Q (collectively referred to as pages 82).

Figure 3C:
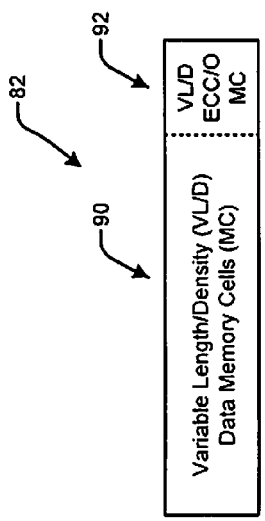
FIG. 3C illustrates a page including memory cells associated with a data portion and an overhead portion.

The control module 72 may vary the number of memory cells per page, the number of bits per memory cell, and/or the relative number of memory cells associated with the data portion and the overhead portion, respectively. The format module 110 may vary locations for pilot data based on the page structure determined by the control module 72. In FIG. 3C, each page 82 includes memory cells that are associated with a data portion 90 and other memory cells that are associated with an overhead portion 92.

In FIG. 3D, the control module 72 communicates with the memory 68. The control module 72 includes the format module 110 that includes the pilot location module 112, a type determining module 114 and/or a signal processing module 115. The signal processing module 115 may determine statistical parameters for disturbances of memory cells. The control module 72 writes pilot data to the locations, and the signal processing module 115 reads the data back and compares the read-back data to the pilot data.

Disturbance characteristics may vary for each physical block of the memory 68. The signal processing module 115 may determine parameters for disturbances based on differences of expected to actual pilot signals. The signal processing module 115 may include an algorithm that determines the parameters.

For example, the algorithm may include representing the pilot data by a first transformation matrix A and representing read-back pilot data by a second transform matrix B. The signal processing module 115 designates differences between matrices A and B as parameters for disturbances. The signal processing module 115 may also adapt the algorithm for subsequent read/write operations. For example, a regularly occurring disturbance may be included in the parameters. The signal processing module 115 may therefore disregard the regularly occurring disturbance for subsequent read/write operations by subtracting the disturbance from the read-back pilot signals before determining the difference between expected and actual pilot signals.

The format module 110 may format the memory 68 based on locations for pilot data. Formatting may include generating a memory map. Therefore, when data that is not pilot data is written to the memory 68 that data is stored in locations other than the locations for pilot data. The format module 110 may also adjust the memory map based on the signal processing algorithm. For example, if the signal processing module 115 determines that disturbances have damaged a portion of the memory 68, the format module 68 may map the memory to discontinue use of that portion.

A type determining module 114 may be used to determine a type of memory that has been connected to the memory control module 72. The type determining module 114 may use any method such as, but not limited to, communicating with the memory 68 and receiving configuration information. The configuration information may be stored in a setup portion of the memory 68 having a standard or predetermined configuration. The control module 72 may read the setup portion and configure the rest of the memory 68.

Once the memory type is determined, the format module 110 may receive memory configuration information from the type determining module 114. Based on the information, the format module 110 may determine a predetermined arrangement of locations for pilot data for both physical and logical pages. The format module 110 may alternatively generate the locations for pilot data. The format module 110 may also determine the start and end of locations or addresses for each page, the density of memory cells, the number of ECC/O bytes per page and generate the locations for pilot data based thereon.

The control module 72 includes a write module 118 and a read module 120, which read and write data to and from the memory 68 based on the memory configuration as determined by the format module 110. The read and write modules 118, 120 read and write data to the locations for pilot data and to other locations in the memory 68.

The write and read modules 118, 120 may employ column and row select modules (not shown) to select memory cells within the memory 68. During a write operation, the write module 118 selects write target cells. The write target cells may include any number of memory cells, such as a particular cell, a row of cells, a column of cells, a block of cells, a page of cells, etc., and pilot data associated with the cells. Once the write target cells are selected, the write module 118 generates a write signal.

During a read operation, the read module 120 selects read target cells, which may include any number of memory cells, such as a particular cell, a row of cells, a column of cells, a block of cells, a page of cells, etc. Once the read target cells are selected, the read module 120 reads the read target cells.

As discussed, the pilot location module 112 may set locations for pilot data in different locations relative to a physical page. For example, the pilot location module 112 may set locations for pilot data at the start, end and/or at a fixed segment (for example, in the middle) of the physical page. The pilot location module 112 may also set locations for pilot data throughout the physical page in a predefined pattern (for example, evenly spaced throughout the physical page).

The pilot location module 112 may also set locations for pilot data in different locations relative to a logical page. For example, the pilot location module 112 may set locations for pilot data at the start, end, and/or at a fixed segment (for example, in the middle) of the logical page. The pilot location module 112 may also set locations for pilot data throughout the logical page in a predefined pattern (for example, evenly spaced throughout the logical page).

The pilot data may experience similar read/write cycles and reside near other data in the memory 68. Pilot signals may be available for processing disturbances for an entire logical page or any segment of the logical page that includes pilot data. Two exemplary sets of locations are illustrated according to first and second embodiments.

Figure 4:
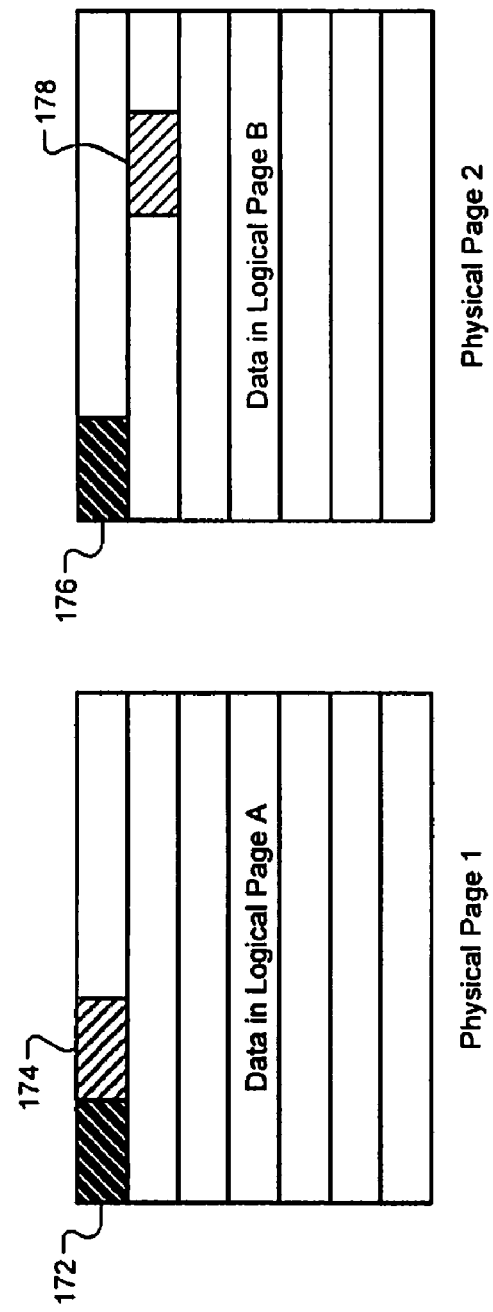
FIG. 4 is a diagram illustrating physical memory space according the present disclosure.

Referring now to FIG. 4, a diagram illustrates physical memory space according to the first embodiment that is generally identified at 170. In the first embodiment, the pilot data is contained in both physical pages and logical pages. The logical page size is illustrated larger than the physical page size. Logical page A starts at the start of physical page 1. The signal processing module 115 may use locations for pilot data 172, 174 in the start of physical page 1 and logical page A to determine disturbances of the partial data of logical page A that resides in physical page 1. The signal processing module 115 may use pilot data in location 176 to determine disturbances of the partial data of logical page A that resides in physical page 2. The signal processing module 115 may use pilot data in location 178 to determine disturbances of logical page B.

Figure 5:
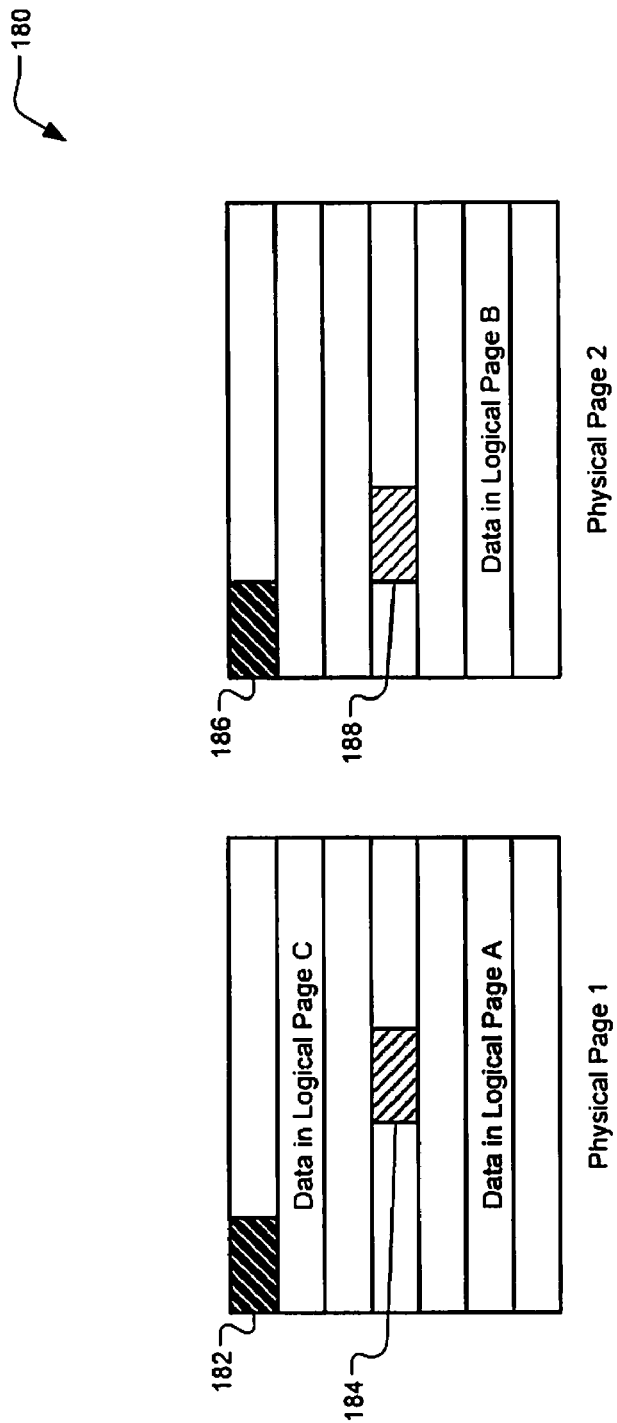
FIG. 5 is a diagram illustrating physical memory space according to the present disclosure.

Referring now to FIG. 5, a diagram illustrates physical memory space according to the first embodiment that is generally identified at 180. The logical page size is illustrated larger than the physical page size. Logical page A starts in the middle of physical page 1. The signal processing module 115 may use pilot data in location 182 to determine disturbances of logical page C. The signal processing module 115 may use pilot data in location 184 to determine disturbances of the partial data of logical page A that resides in physical page 1. The signal processing module 115 may use pilot data in location 186 to determine disturbances of the partial data of logical page A that resides in physical page 2. The signal processing module 115 may use pilot data in location 188 to determine disturbances of logical page B.

Figure 6:
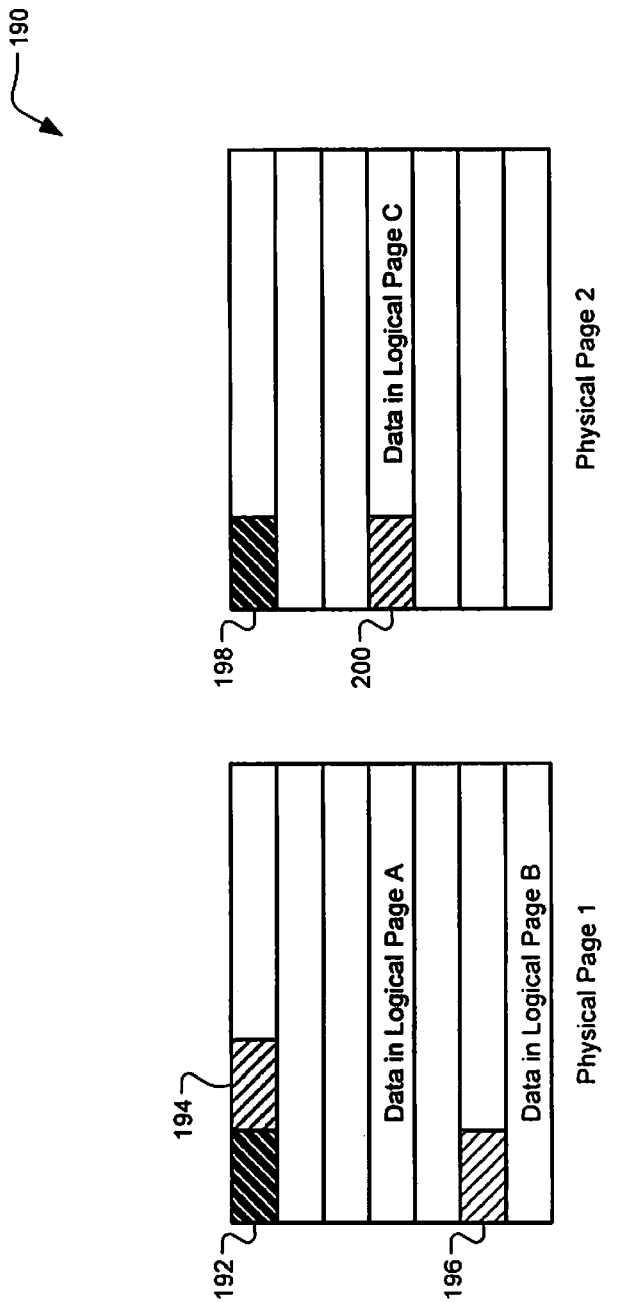
FIG. 6 is a diagram illustrating physical memory space according to the present disclosure.

Referring now to FIG. 6, a diagram illustrates physical memory space according to the first embodiment that is generally identified at 190. The logical page size is smaller than the physical page size. Logical page A starts in the start of physical page 1. The signal processing module 115 may use pilot data in locations 192, 194 to determine disturbances of logical page A. The signal processing module 115 may use pilot data in location 196 to determine disturbances of the partial data of logical page B that resides in physical page 1. The signal processing module 115 may use pilot data in location 198 to determine disturbances of the partial data of logical page B that resides in physical page 2. The signal processing module 115 may use pilot data in location 200 to determine disturbances of the data of logical page C.

Figure 7:
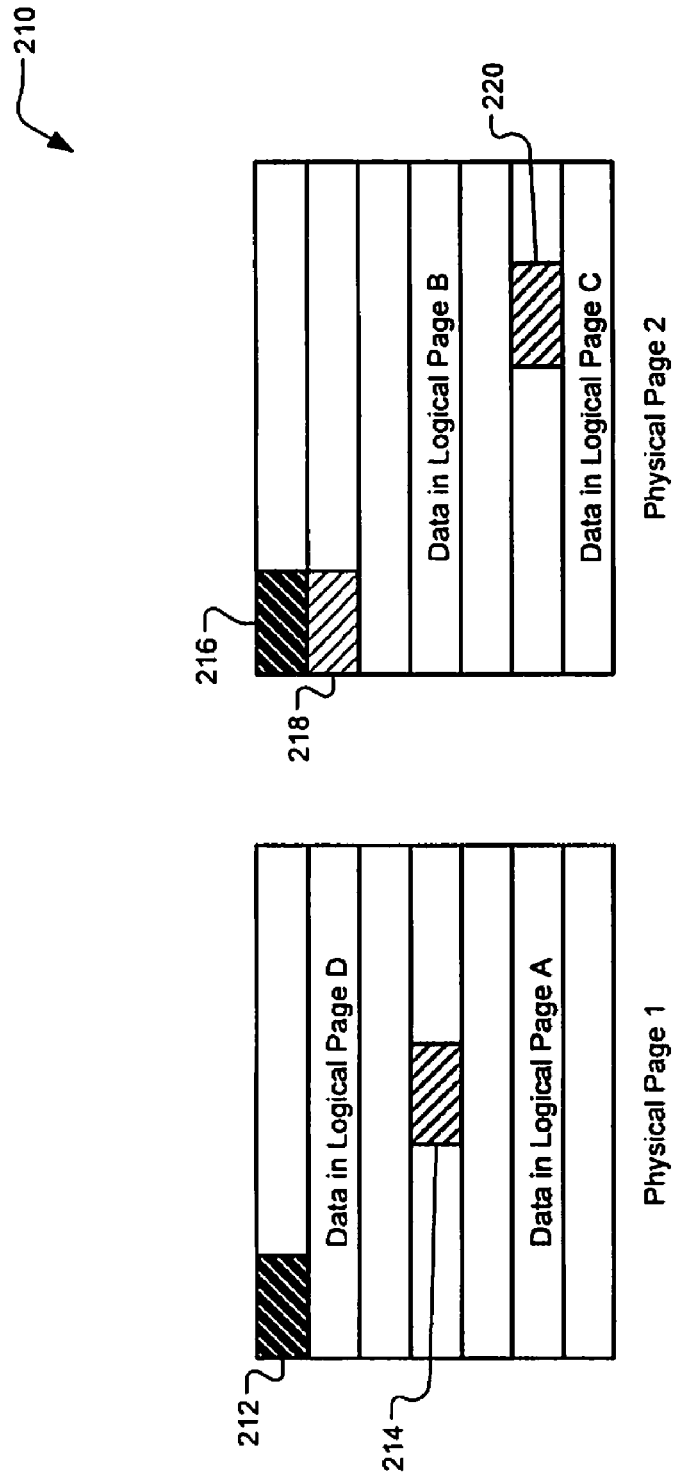
FIG. 7 is a diagram illustrating physical memory space according to the present disclosure.

Referring now to FIG. 7, a diagram illustrates physical memory space according to the first embodiment that is generally identified at 210. The logical page size is smaller than the physical page size. Logical page A starts in the middle of physical page 1. The signal processing module 115 may use pilot data in location 212 to determine disturbances of logical page D. The signal processing module 115 may use pilot data in location 214 to determine disturbances of the partial data of logical page A that resides in physical page 1. The signal processing module 115 may use pilot data in location 216 to determine disturbances of the partial data of logical page A that resides in physical page 2. The signal processing module 115 may use pilot data in location 218 to determine disturbances of logical page B. The signal processing module 115 may use pilot data in location 220 to determine disturbances of logical page C.

Figure 8:
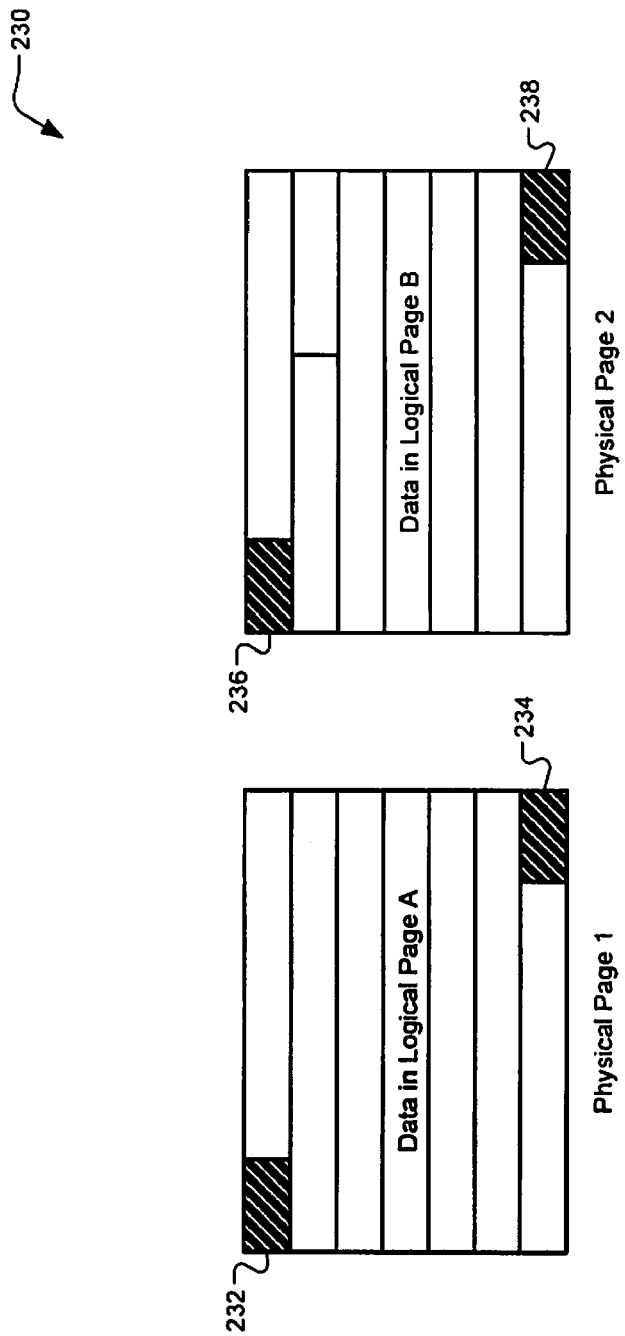
FIG. 8 is a diagram illustrating physical memory space according to the present disclosure.
Figure 9:
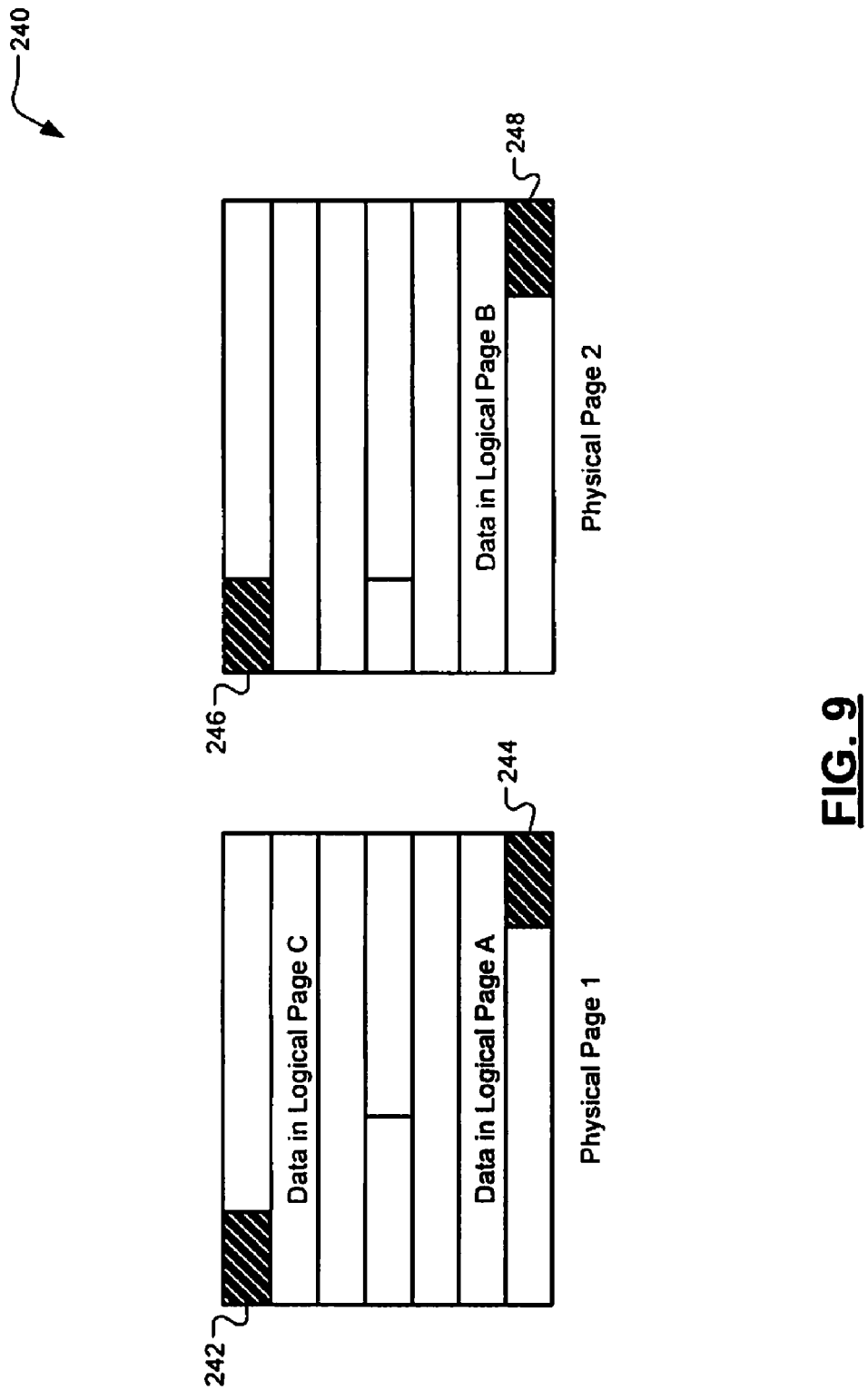
FIG. 9 is a diagram illustrating physical memory space according to the present disclosure.

Referring now to FIGS. 8-9, diagrams illustrate physical memory space according to the second embodiment of the present disclosure. The second embodiment may be used when the logical page size is illustrated larger than the physical page size. According to the second embodiment, pilot data is located at fixed locations within a physical page, however, pilot data is written when the logical pages are written. In other words, if the current logical page covers the entire physical page, both the start and end locations for pilot data are written. Otherwise, only the start locations for pilot data are written. The end locations for pilot data are written along with the next logical page which fills in the entire physical page.

Referring now to FIG. 8, a diagram illustrates physical memory space according to the second embodiment that is generally identified at 230. The logical page size is illustrated larger than the physical page size. Logical page A starts in the start of physical page 1. The signal processing module 115 may use pilot data from locations 232, 234 to determine disturbances of partial data of logical page A that resides in physical page 1. The signal processing module 115 may use pilot data from location 236 to determine disturbances of the partial data of logical page A that resides in physical page 2. The signal processing module 115 may use pilot data from location 238 to determine disturbances of logical page B.

Referring now to FIG. 9, a diagram illustrates physical memory space according to the second embodiment that is generally identified at 240. The logical page size may be larger than the physical page size. Logical page A starts in the middle of physical page 1. The signal processing module 115 may use pilot data from location 242 to determine disturbances of logical page C. The signal processing module 115 may use pilot data from location 244 to determine disturbances of the partial data of logical page A that resides in physical page 1. The signal processing module 115 may use pilot data from location 246 to determine disturbances of the partial data of logical page A that resides in physical page 2. The signal processing module 115 may use pilot data from location 248 to determine disturbances of logical page B.

Figure 10:
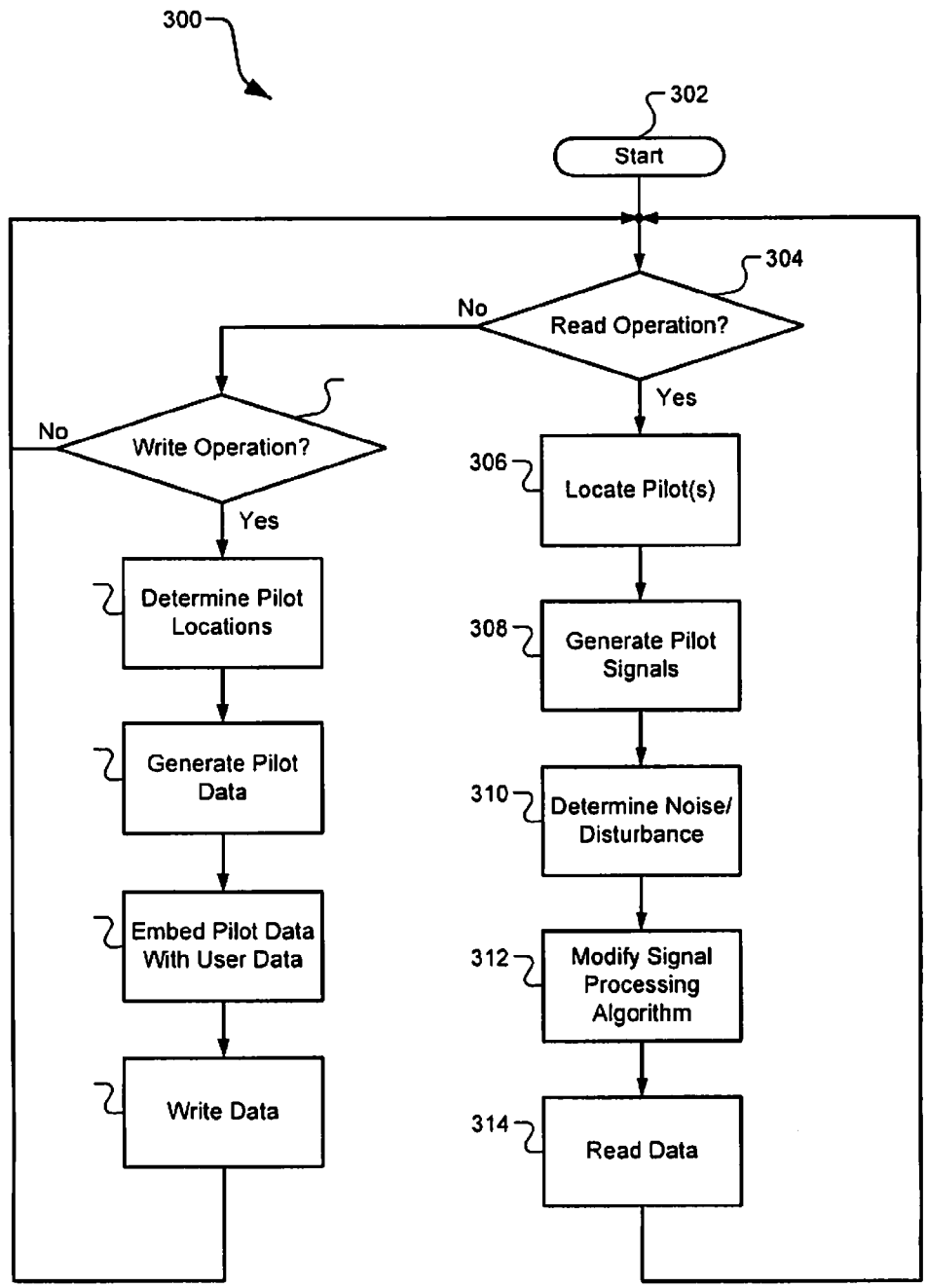
FIG. 10 is a flowchart illustrating the operation of the non-volatile memory according to the present disclosure.

Referring now to FIG. 10, an exemplary flowchart 300 illustrates the operation of the system. The process begins in step 302. In step 304, the system determines whether a read operation is requested. If true, the system proceeds to step 306. If false, the system returns to step 304. In step 306, the system locates locations for pilot data in the targeted data block. In step 308, the system generates pilot signals based on pilot data from locations in memory. In step 310, the system determines disturbance parameters of the memory based on the pilot signals. In step 312, the system modifies a signal processing algorithm based on the disturbance parameters. For example, the signal processing module 115 may modify the algorithm for subsequent read/write operations when it determines a regularly occurring disturbance is included in the parameters. The signal processing module 115 may therefore disregard the regularly occurring disturbance for subsequent read/write operations by subtracting the disturbance from the read-back pilot signals before determining the difference between expected and actual pilot signals. In step 314, the system reads the targeted data from the memory using the modified signal processing algorithm. The system then returns to step 304.

In step 316, the system determines whether a write operation is requested. If true, the system proceeds to step 318. In step 318, the system selects locations for pilots in the targeted data block. In step 320, the system generates pilot data. In step 322, the system embeds the pilot data with user data. In step 324, the system writes the user data along with the embedded pilot data.

Referring now to FIGS. 11A-11H, various exemplary implementations incorporating the teachings of the present disclosure are shown.

Figure 11A:
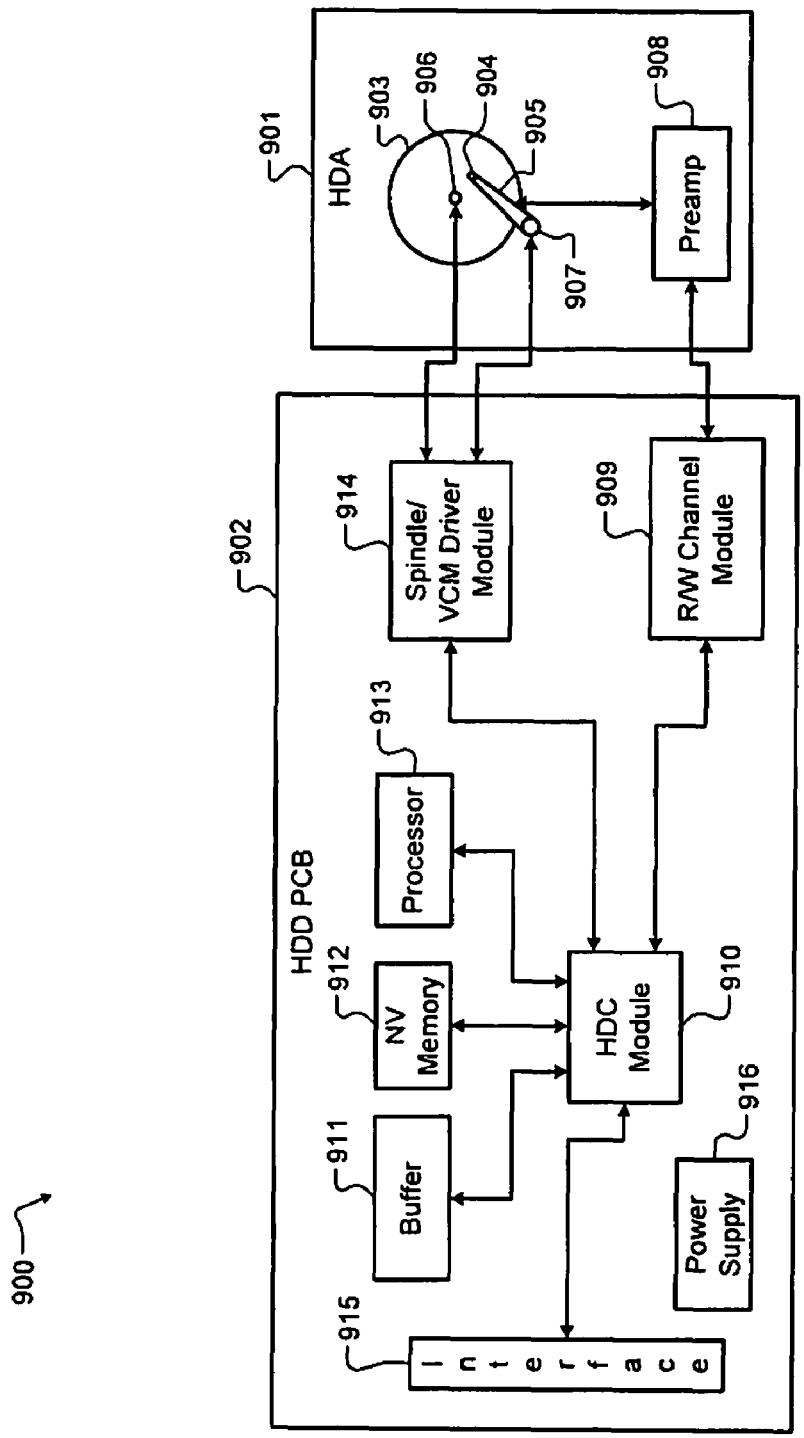
FIG. 11A is a functional block diagram of a hard disk drive.

Referring now to FIG. 11A, the teachings of the disclosure can be implemented in non-volatile memory 912 of a hard disk drive (HDD) 900. The HDD 900 includes a hard disk assembly (HDA) 901 and an HDD printed circuit board (PCB) 902. The HDA 901 may include a magnetic medium 903, such as one or more platters that store data, and a read/write device 904. The read/write device 904 may be arranged on an actuator arm 905 and may read and write data on the magnetic medium 903. Additionally, the HDA 901 includes a spindle motor 906 that rotates the magnetic medium 903 and a voice-coil motor (VCM) 907 that actuates the actuator arm 905. A preamplifier device 908 amplifies signals generated by the read/write device 904 during read operations and provides signals to the read/write device 904 during write operations.

The HDD PCB 902 includes a read/write channel module (hereinafter, "read channel") 909, a hard disk control module (HDC) module 910, a buffer 911, non-volatile memory 912, a processor 913, and a spindle/VCM driver module 914. The read channel 909 processes data received from and transmitted to the preamplifier device 908. The HDC module 910 controls components of the HDA 901 and communicates with an external device (not shown) via an I/O interface 915. The external device may include a computer, a multimedia device, a mobile computing device, etc. The I/O interface 915 may include wireline and/or wireless communication links.

The HDC module 910 may receive data from the HDA 901, the read channel 909, the buffer 911, non-volatile memory 912, the processor 913, the spindle/VCM driver module 914, and/or the I/O interface 915. The processor 913 may process the data, including encoding, decoding, filtering, and/or formatting. The processed data may be output to the HDA 901, the read channel 909, the buffer 911, non-volatile memory 912, the processor 913, the spindle/VCM driver module 914, and/or the I/O interface 915.

The HDC module 910 may use the buffer 911 and/or non-volatile memory 912 to store data related to the control and operation of the HDD 900. The buffer 911 may include DRAM, SDRAM, etc. Non-volatile memory 912 may include any suitable type of semiconductor or solid-state memory, such as flash memory (including NAND and NOR flash memory), phase change memory, magnetic RAM, and multi-state memory, in which each memory cell has more than two states. The spindle/VCM driver module 914 controls the spindle motor 906 and the VCM 907. The HDD PCB 902 includes a power supply 916 that provides power to the components of the HDD 900.

Figure 11B:
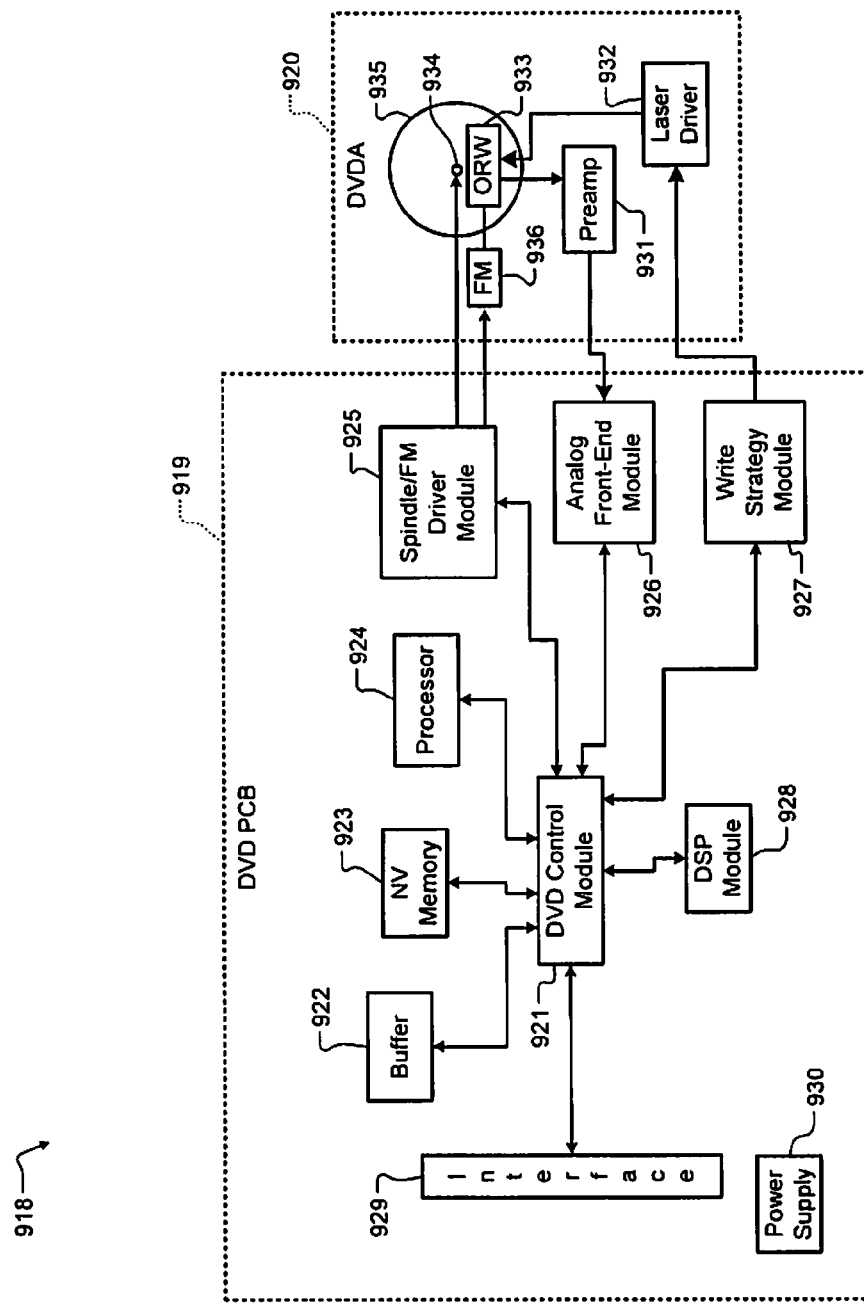
FIG. 11B is a functional block diagram of a DVD drive.

Referring now to FIG. 11B, the teachings of the disclosure can be implemented in non-volatile memory 923 of a DVD drive 918 or of a CD drive (not shown). The DVD drive 918 includes a DVD PCB 919 and a DVD assembly (DVDA) 920. The DVD PCB 919 includes a DVD control module 921, a buffer 922, non-volatile memory 923, a processor 924, a spindle/FM (feed motor) driver module 925, an analog front-end module 926, a write strategy module 927, and a DSP module 928.

The DVD control module 921 controls components of the DVDA 920 and communicates with an external device (not shown) via an I/O interface 929. The external device may include a computer, a multimedia device, a mobile computing device, etc. The I/O interface 929 may include wireline and/or wireless communication links.

The DVD control module 921 may receive data from the buffer 922, non-volatile memory 923, the processor 924, the spindle/FM driver module 925, the analog front-end module 926, the write strategy module 927, the DSP module 928, and/or the I/O interface 929. The processor 924 may process the data, including encoding, decoding, filtering, and/or formatting. The DSP module 928 performs signal processing, such as video and/or audio coding/decoding. The processed data may be output to the buffer 922, non-volatile memory 923, the processor 924, the spindle/FM driver module 925, the analog front-end module 926, the write strategy module 927, the DSP module 928, and/or the I/O interface 929.

The DVD control module 921 may use the buffer 922 and/or non-volatile memory 923 to store data related to the control and operation of the DVD drive 918. The buffer 922 may include DRAM, SDRAM, etc. Non-volatile memory 923 may include any suitable type of semiconductor or solid-state memory, such as flash memory (including NAND and NOR flash memory), phase change memory, magnetic RAM, and multi-state memory, in which each memory cell has more than two states. The DVD PCB 919 includes a power supply 930 that provides power to the components of the DVD drive 918.

The DVDA 920 may include a preamplifier device 931, a laser driver 932, and an optical device 933, which may be an optical read/write (ORW) device or an optical read-only (OR) device. A spindle motor 934 rotates an optical storage medium 935, and a feed motor 936 actuates the optical device 933 relative to the optical storage medium 935.

When reading data from the optical storage medium 935, the laser driver provides a read power to the optical device 933. The optical device 933 detects data from the optical storage medium 935, and transmits the data to the preamplifier device 931. The analog front-end module 926 receives data from the preamplifier device 931 and performs such functions as filtering and A/D conversion. To write to the optical storage medium 935, the write strategy module 927 transmits power level and timing data to the laser driver 932. The laser driver 932 controls the optical device 933 to write data to the optical storage medium 935.

Figure 11D:
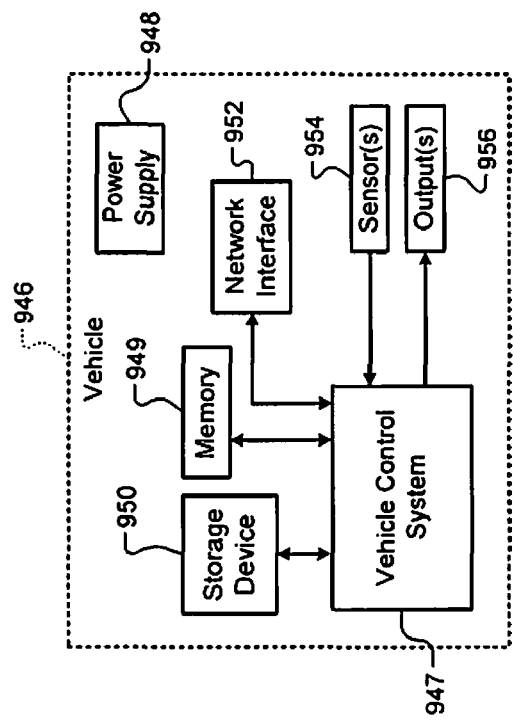
FIG. 11D is a functional block diagram of a vehicle control system.
Figure 11C:
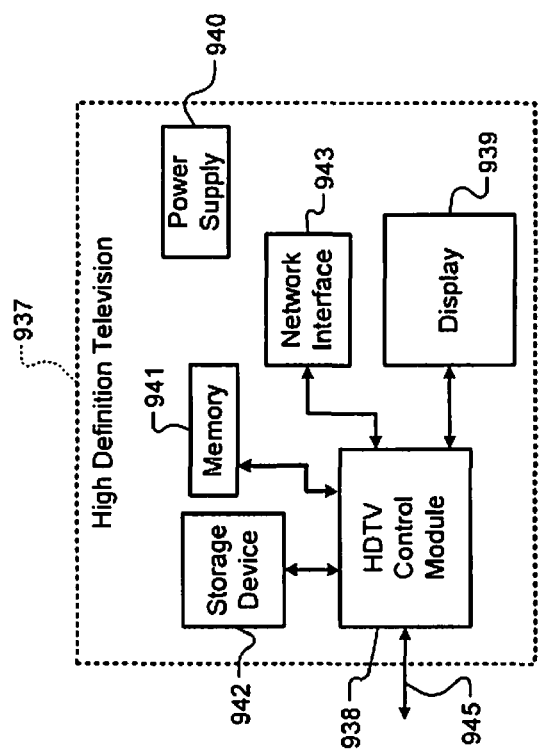
FIG. 11C is a functional block diagram of a high definition television.

Referring now to FIG. 11C, the teachings of the disclosure can be implemented in non-volatile memory 941 of a high definition television (HDTV) 937. The HDTV 937 includes an HDTV control module 938, a display 939, a power supply 940, memory 941, a storage device 942, a network interface 943, and an external interface 945. If the network interface 943 includes a wireless local area network interface, an antenna (not shown) may be included.

The HDTV 937 can receive input signals from the network interface 943 and/or the external interface 945, which can send and receive data via cable, broadband Internet, and/or satellite. The HDTV control module 938 may process the input signals, including encoding, decoding, filtering, and/or formatting, and generate output signals. The output signals may be communicated to one or more of the display 939, memory 941, the storage device 942, the network interface 943, and the external interface 945.

Memory 941 may include random access memory (RAM) and/or non-volatile memory. Non-volatile memory may include any suitable type of semiconductor or solid-state memory, such as flash memory (including NAND and NOR flash memory), phase change memory, magnetic RAM, and multi-state memory, in which each memory cell has more than two states. The storage device 942 may include an optical storage drive, such as a DVD drive, and/or a hard disk drive (HDD). The HDTV control module 938 communicates externally via the network interface 943 and/or the external interface 945. The power supply 940 provides power to the components of the HDTV 937.

Referring now to FIG. 11D, the teachings of the disclosure may be implemented in non-volatile memory 949 of a vehicle 946. The vehicle 946 may include a vehicle control system 947, a power supply 948, memory 949, a storage device 950, and a network interface 952. If the network interface 952 includes a wireless local area network interface, an antenna (not shown) may be included. The vehicle control system 947 may be a powertrain control system, a body control system, an entertainment control system, an anti-lock braking system (ABS), a navigation system, a telematics system, a lane departure system, an adaptive cruise control system, etc.

The vehicle control system 947 may communicate with one or more sensors 954 and generate one or more output signals 956. The sensors 954 may include temperature sensors, acceleration sensors, pressure sensors, rotational sensors, airflow sensors, etc. The output signals 956 may control engine operating parameters, transmission operating parameters, suspension parameters, etc.

The power supply 948 provides power to the components of the vehicle 946. The vehicle control system 947 may store data in memory 949 and/or the storage device 950. Memory 949 may include random access memory (RAM) and/or non-volatile memory. Non-volatile memory may include any suitable type of semiconductor or solid-state memory, such as flash memory (including NAND and NOR flash memory), phase change memory, magnetic RAM, and multi-state memory, in which each memory cell has more than two states. The storage device 950 may include an optical storage drive, such as a DVD drive, and/or a hard disk drive (HDD). The vehicle control system 947 may communicate externally using the network interface 952.

Figure 11F:
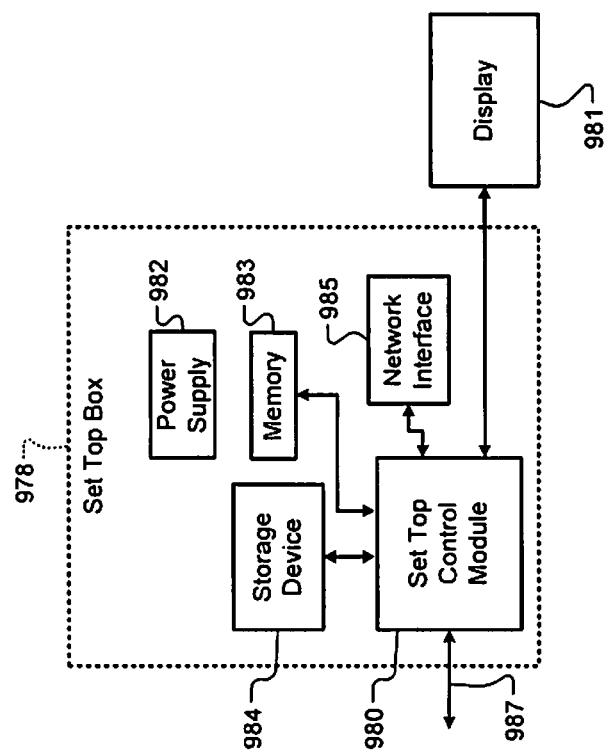
FIG. 11F is a functional block diagram of a set top box.
Figure 11E:
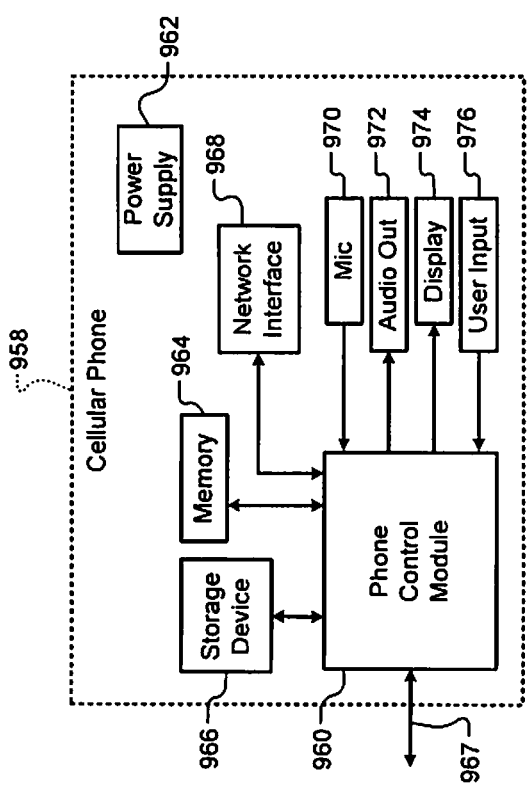
FIG. 11E is a functional block diagram of a cellular phone.

Referring now to FIG. 11E, the teachings of the disclosure can be implemented in non-volatile memory 964 of a cellular phone 958. The cellular phone 958 includes a phone control module 960, a power supply 962, memory 964, a storage device 966, and a cellular network interface 967. The cellular phone 958 may include a network interface 968, a microphone 970, an audio output 972 such as a speaker and/or output jack, a display 974, and a user input device 976 such as a keypad and/or pointing device. If the network interface 968 includes a wireless local area network interface, an antenna (not shown) may be included.

The phone control module 960 may receive input signals from the cellular network interface 967, the network interface 968, the microphone 970, and/or the user input device 976. The phone control module 960 may process signals, including encoding, decoding, filtering, and/or formatting, and generate output signals. The output signals may be communicated to one or more of memory 964, the storage device 966, the cellular network interface 967, the network interface 968, and the audio output 972.

Memory 964 may include random access memory (RAM) and/or non-volatile memory. Non-volatile memory may include any suitable type of semiconductor or solid-state memory, such as flash memory (including NAND and NOR flash memory), phase change memory, magnetic RAM, and multi-state memory, in which each memory cell has more than two states. The storage device 966 may include an optical storage drive, such as a DVD drive, and/or a hard disk drive (HDD). The power supply 962 provides power to the components of the cellular phone 958.

Referring now to FIG. 11F, the teachings of the disclosure can be implemented in non-volatile memory 983 of a set top box 978. The set top box 978 includes a set top control module 980, a display 981, a power supply 982, memory 983, a storage device 984, and a network interface 985. If the network interface 985 includes a wireless local area network interface, an antenna (not shown) may be included.

The set top control module 980 may receive input signals from the network interface 985 and an external interface 987, which can send and receive data via cable, broadband Internet, and/or satellite. The set top control module 980 may process signals, including encoding, decoding, filtering, and/or formatting, and generate output signals. The output signals may include audio and/or video signals in standard and/or high definition formats. The output signals may be communicated to the network interface 985 and/or to the display 981. The display 981 may include a television, a projector, and/or a monitor.

The power supply 982 provides power to the components of the set top box 978. Memory 983 may include random access memory (RAM) and/or non-volatile memory. Non-volatile memory may include any suitable type of semiconductor or solid-state memory, such as flash memory (including NAND and NOR flash memory), phase change memory, magnetic RAM, and multi-state memory, in which each memory cell has more than two states. The storage device 984 may include an optical storage drive, such as a DVD drive, and/or a hard disk drive (HDD).

Referring now to FIG. 11G, the teachings of the disclosure can be implemented in non-volatile memory 992 of a mobile device 989. The mobile device 989 may include a mobile device control module 990, a power supply 991, memory 992, a storage device 993, a network interface 994, and an external interface 999. If the network interface 994 includes a wireless local area network interface, an antenna (not shown) may be included.

The mobile device control module 990 may receive input signals from the network interface 994 and/or the external interface 999. The external interface 999 may include USB, infrared, and/or Ethernet. The input signals may include compressed audio and/or video, and may be compliant with the MP3 format. Additionally, the mobile device control module 990 may receive input from a user input 996 such as a keypad, touchpad, or individual buttons. The mobile device control module 990 may process input signals, including encoding, decoding, filtering, and/or formatting, and generate output signals.

The mobile device control module 990 may output audio signals to an audio output 997 and video signals to a display 998. The audio output 997 may include a speaker and/or an output jack. The display 998 may present a graphical user interface, which may include menus, icons, etc. The power supply 991 provides power to the components of the mobile device 989. Memory 992 may include random access memory (RAM) and/or non-volatile memory.

Non-volatile memory may include any suitable type of semiconductor or solid-state memory, such as flash memory (including NAND and NOR flash memory), phase change memory, magnetic RAM, and multi-state memory, in which each memory cell has more than two states. The storage device 993 may include an optical storage drive, such as a DVD drive, and/or a hard disk drive (HDD). The mobile device may include a personal digital assistant, a media player, a laptop computer, a gaming console, or other mobile computing device.

Figure 11H:
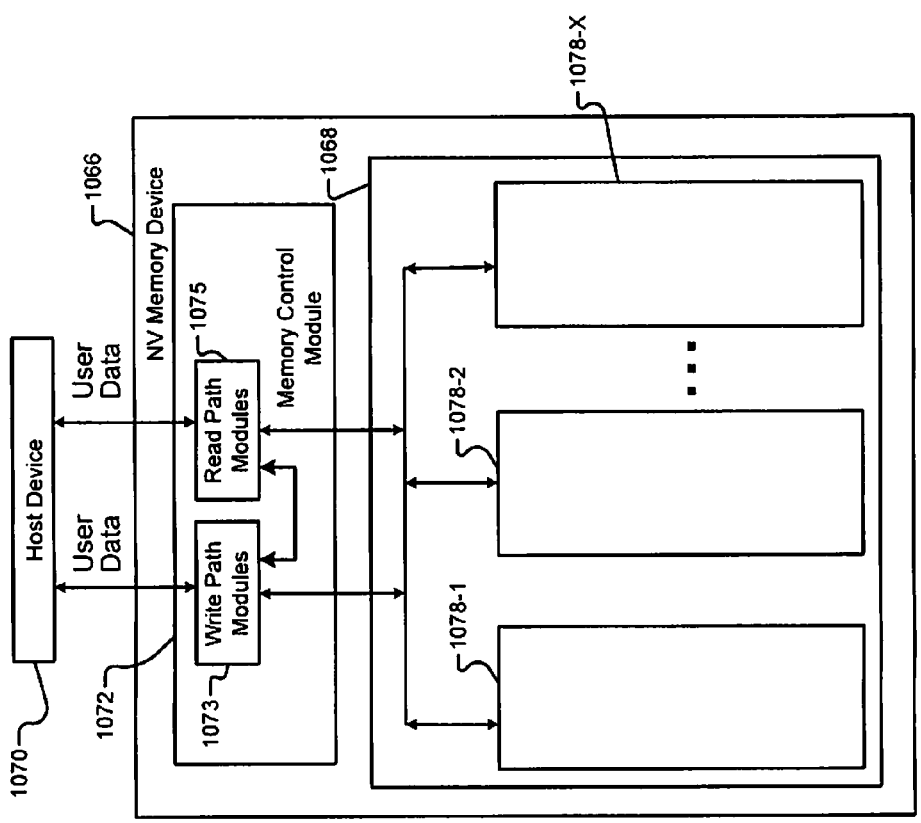
FIG. 11H is a functional block diagram of a solid state storage device.

Referring now to FIG. 11H, the teachings of the disclosure can be implemented in non-volatile memory of a solid state storage device 1066. The solid state storage device 1066 includes a memory control module 1072 and the non-volatile memory 1068. The memory control module 1072 may communicate with a host device 1070. The non-volatile memory 1068 may include any suitable type of semiconductor or solid-state memory, such as flash memory (including NAND and NOR flash memory), phase change memory, magnetic RAM, and multi-state memory, in which each memory cell has more than two states. The memory control module 1072 may communicate with the non-volatile memory 68 via write and read path modules 1073, 1075 that erase, write to and read from one or more arrays 1078-1, 1078-2, . . . , and 1078-X of memory cells that may each correspond to one or more memory chips.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A memory control module, comprising:
   a format module in communication with a memory array, wherein the memory array comprises B memory blocks configured to store user data, wherein each of the B memory blocks of the memory array comprises P physical pages and Q logical pages, and wherein the format module is configured to
   in each of the B memory blocks, i) select X predetermined locations, and ii) write pilot data into the X predetermined locations, wherein read-back pilot signals are generated based on reading the pilot data written into the X predetermined locations,
   wherein the X predetermined locations are distributed in each of the B memory blocks according to a first predetermined pattern,
   wherein the X predetermined locations according to the first predetermined pattern are selected based on i) a page structure of the P physical pages and ii) a page structure of the Q logical pages,
   wherein the page structure of each given page of the P physical pages and the Q logical pages includes a total number of memory cells in the given page, a number of bits per memory cell, a first number of memory cells associated with a data portion of the given page, and a second number of memory cells associated with an ECC/overhead portion of the given page, where the total number of memory cells is a sum of the first number of memory cells and the second number of memory cells,
   wherein B, P, Q, and X are integers greater than or equal to 1, and
   wherein the pilot data includes a second predetermined pattern that is different than the user data; and
   a signal processing module configured to, for each of the B memory blocks,
   compare the pilot data written into the X predetermined locations to the read-back pilot signals, and
   determine, based on the comparison, variations between the pilot data written into the X predetermined locations and the read-back pilot signals.

2. The memory control module of claim 1, wherein the pilot data is embedded with the user data during read, write, and erase operations of the memory array.

3. The memory control module of claim 1, wherein the format module is further configured to selectively set a start or an end for each of the Q logical pages.

4. The memory control module of claim 1, wherein the format module is further configured to selectively set a start or an end for each of the P physical pages.

5. The memory control module of claim 1, further comprising at least one of:
   a write module configured to selectively write data including the pilot data to the memory array; and
   a read module configured to selectively read back the data from the memory array.

6. The memory control module of claim 1, wherein the signal processing module is further configured to at least one of (i) ignore the variations in subsequent read/write operations and (ii) not write/read from the locations in the memory array where the variations occur in subsequent read/write operations.

7. The memory control module of claim 6, wherein the variations are caused at least in part by (i) physical disturbances to the memory array or (ii) defects within the memory array.

8. The memory control module of claim 1, further comprising:
   a pilot location module configured to set M of the X predetermined locations,
   wherein each of the Q logical pages includes a start or an end, and
   wherein the M predetermined locations are the same for each of the Q logical pages relative to the start and end, where M is an integer greater than or equal to 1.

9. The memory control module of claim 8, wherein the pilot location module is further configured to set at least one of the M predetermined locations at the start, the end, and a location within each of the Q logical pages.

10. The memory control module of claim 9, wherein the location includes a middle of each of the Q logical pages.

11. The memory control module of claim 9, wherein the pilot location module is further configured to set the M predetermined locations in the first predetermined pattern within each of the Q logical pages.

12. The memory control module of claim 9, wherein the pilot location module is further configured to:
   set the at least one of the M predetermined locations at the start, and
   further set at least another one of the M predetermined locations next to the end.

13. The memory control module of claim 1, further comprising:
   a pilot location module configured to set M of the X predetermined locations,
   wherein each of the P physical pages includes a start or an end, and
   wherein the M predetermined locations are the same for each of the P physical pages relative to the start and end, where M is an integer greater than or equal to 1.

14. The memory control module of claim 13, wherein the pilot location module is further configured to set at least one of the M predetermined locations at the start, the end, and a location within each of the P physical pages.

15. The memory control module of claim 14, wherein the location includes a middle of each of the P physical pages.

16. The memory control module of claim 14, wherein the pilot location module is further configured to set the M predetermined locations in the first predetermined pattern within each of the P physical pages.

17. The memory control module of claim 14, wherein the pilot location module is further configured to:
   set the at least one of the M predetermined locations at the start, and
   further set at least another one of the M predetermined locations next to the end.

18. A memory system comprising:
   the memory control module of claim 1; and
   the memory array.

19. The memory system of claim 18, wherein the memory array comprises at least one of flash memory, static random access memory (SRAM), nitride read only memory (NROM), phase change memory, magnetic RAM, and multi-state memory.

20. The memory control module of claim 1, wherein the format module is further configured to generate a memory map of the memory array.

21. The memory control module of claim 20, wherein the format module is further configured to at least one of (i) adjust the memory map to indicate portions of the memory array where the variations occur and (ii) discontinue use of the portions of the memory array where the variations occur.

22. A method for operating a memory control module, the method comprising:
   selecting X predetermined locations to write pilot data in each of B memory blocks of a memory array,
      wherein each of the B memory blocks is used to write user data and includes P physical pages and Q logical pages,
      wherein the X predetermined locations are distributed in each of the B memory blocks according to a first predetermined pattern,
      wherein the X predetermined locations according to the first predetermined pattern are selected based on a page structure of the P physical pages and Q logical pages,
      wherein the page structure of each given page of the P physical pages and the Q logical pages includes a total number of memory cells in the given page, a number of bits per memory cell, a first number of memory cells associated with a data portion of the given page, and a second number of memory cells associated with an ECC/overhead portion of the given page, where the total number of memory cells is a sum of the first number of memory cells and the second number of memory cells,
      wherein B, P, Q and X are integers greater than or equal to 1, and
      wherein the pilot data includes a second predetermined pattern that is different than the user data;
   generating read-back pilot signals based on reading the pilot data written into the X predetermined location;
   comparing the written pilot data to the read-back pilot signals; and
   determining, based on the comparison, variations between the pilot data written into the X predetermined location and the read-back pilot.

23. The method of claim 22, further comprising reading, writing, and erasing pilot data embedded in user data.

24. The method of claim 22, further comprising selectively setting a start or an end for each of the Q logical pages.

25. The method of claim 22, further comprising selectively setting a start or an end for each of the P physical pages.

26. The method of claim 22, further comprising at least one of (i) selectively writing data that includes the pilot data to the memory array and (ii) selectively reading back the data from the memory array.

27. The method of claim 22, further comprising at least one of (i) ignoring the variations in subsequent read/write operations and (ii) not writing/reading from the locations in the memory array where the variations occur in subsequent read/write operations.

28. The method of claim 27, wherein the variations are caused at least in part from physical disturbances to the memory array or defects within the memory array.

29. The method of claim 22, further comprising:
setting M of the X predetermined locations,
wherein each of the Q logical pages includes a start or an end, and
wherein the M predetermined locations are the same for each of the Q logical pages relative to the start and end, where M is an integer greater than or equal to 1.

30. The method of claim 29, further comprising setting at least one of the M predetermined locations at the start, the end, and a location within each of the Q logical pages.

31. The method of claim 30, wherein the location includes a middle of each of the Q logical pages.

32. The method of claim 30, further comprising setting the M predetermined locations in the first predetermined pattern within each of the Q logical pages.

33. The method of claim 30, further comprising:
setting the at least one of the M predetermined locations at the start; and
setting at least another one of the M predetermined locations next to the end.

34. The method of claim 22, further comprising:
setting M of the X predetermined locations,
wherein each of the P physical pages includes a start or an end, and
wherein the M predetermined locations are the same for each of the P physical pages relative to the start and end, where M is an integer greater than or equal to 1.

35. The method of claim 34, further comprising setting at least one of the M predetermined locations at the start, the end, and a location within each of the P physical pages.

36. The method of claim 35 wherein the location includes a middle of each of the P physical pages.

37. The method of claim 35, further comprising setting the M predetermined locations in the first predetermined pattern within each of the P physical pages.

38. The method of claim 35, further comprising:
setting the at least one of the M predetermined locations at the start; and
setting at least another one of the M predetermined locations next to the end.

39. The method of claim 22, wherein the memory array comprises at least one of flash memory, static random access memory (SRAM), nitride read only memory (NROM), phase change memory, magnetic RAM, and multi-state memory.

40. The method of claim 22, further comprising generating a memory map of the memory array.

41. The method of claim 40, further comprising at least one of (i) adjusting the memory map to indicate portions of the memory array where the variations occur and (ii) discontinue use of the portions of the memory array where the variations occur.

42. The memory control module of claim 1, wherein the X predetermined locations to write the pilot data are evenly spaced throughout the P physical pages and Q logical pages.

43. The memory control module of claim 1, wherein the pilot data is different than ECC data.

* * * * *

UNITED STATES PATENT AND TRADEMARK OFFICE
CERTIFICATE OF CORRECTION

PATENT NO. : 8,316,206 B2
APPLICATION NO. : 12/029134
DATED : November 20, 2012
INVENTOR(S) : Yang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 824 days.

Signed and Sealed this
Twenty-eighth Day of October, 2014

Michelle K. Lee
*Deputy Director of the United States Patent and Trademark Office*